US011736113B2

(12) United States Patent
Tsai et al.

(10) Patent No.: US 11,736,113 B2
(45) Date of Patent: Aug. 22, 2023

(54) AUTOMATIC HYBRID OSCILLATOR GAIN ADJUSTOR CIRCUIT

(71) Applicant: Taiwan Semiconductor Manufacturing Company, Ltd., Hsinchu (TW)

(72) Inventors: Tsung-Hsien Tsai, Taoyuan County (TW); Ya-Tin Chang, Hsinchu (TW); Ruey-Bin Sheen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/572,696

(22) Filed: Jan. 11, 2022

(65) Prior Publication Data

US 2023/0012436 A1  Jan. 12, 2023

Related U.S. Application Data

(60) Provisional application No. 63/219,866, filed on Jul. 9, 2021.

(51) Int. Cl.
*H03L 7/099* (2006.01)
*H03L 7/087* (2006.01)
*H03L 7/107* (2006.01)
*H03K 3/03* (2006.01)

(52) U.S. Cl.
CPC ............ *H03L 7/0995* (2013.01); *H03L 7/087* (2013.01); *H03L 7/107* (2013.01); *H03K 3/0315* (2013.01); *H03L 2207/06* (2013.01)

(58) Field of Classification Search
CPC ....... H03L 7/087; H03L 7/099; H03L 7/0995; H03L 7/10; H03L 7/107; H03K 3/0322
See application file for complete search history.

(56) References Cited

U.S. PATENT DOCUMENTS

| 4,272,729 A | 6/1981 | Riley, Jr. |
| 6,407,641 B1 | 6/2002 | Williams et al. |
| 7,180,377 B1 | 2/2007 | Leong et al. |
| (Continued) | | |

FOREIGN PATENT DOCUMENTS

| CN | 106357237 | 1/2017 |
| TW | 201206085 | 2/2012 |

OTHER PUBLICATIONS

Taiwanese Office Action, Application No. 111108987, dated Nov. 18, 2022.

*Primary Examiner* — Ryan Johnson
(74) *Attorney, Agent, or Firm* — Jones Day

(57) ABSTRACT

An automatic gain adjustor for a hybrid oscillator can be employed to overcome the frequency limitations of hybrid phase lock loops (PLLs). For example, an automatic gain adjustor for a hybrid oscillator can include a hybrid oscillator that is configured to receive a coarse tuning signal and a gain adjustment signal and generate an output signal with any frequency within the specified frequency range of the hybrid PLL. The automatic gain adjustor for a hybrid PLL may further include a fine tuning array that receives one or more fine tuning selection signals and generates a gain adjustment signal that is received by the hybrid oscillator. The fine tuning array generates a gain adjustment signal to adjust the gain of the hybrid oscillator according to an operating frequency range of the hybrid oscillator.

20 Claims, 15 Drawing Sheets

(56) References Cited

U.S. PATENT DOCUMENTS

| | | | |
|---|---|---|---|
| 7,808,288 B2 | 10/2010 | Kallol | |
| 2007/0030079 A1* | 2/2007 | Kawamoto | H03L 7/0995 |
| | | | 331/16 |
| 2007/0040617 A1* | 2/2007 | Koukab | H03L 7/1075 |
| | | | 331/16 |
| 2010/0090768 A1* | 4/2010 | Yamazaki | H03L 7/0995 |
| | | | 331/15 |
| 2010/0127739 A1* | 5/2010 | Ebuchi | H03L 7/197 |
| | | | 327/148 |
| 2018/0152192 A1* | 5/2018 | Tsai | H03L 7/0991 |

* cited by examiner

| over_ana (610) | under_ana (611) | ov_band(dig_band_in>30) (619) | ud_band(dig_band_in<1) (618) | C_check (630) | B_check (631) | sign_value[1:0] (712) |
|---|---|---|---|---|---|---|
| 1'b0 | 1'b0 | 1'b0 | 1'b0 | 1'b0 | 1'b0 | 2'b00 |
| 1'b0 | 1'b0 | 1'b1 | 1'b0 | 1'b0 | 1'b0 | 2'b00 |
| 1'b1 | 1'b0 | 1'b0 | 1'b1 | 1'b0 | 1'b0 | 2'b00 |
| 1'b0 | 1'b1 | 1'b0 | 1'b0 | 1'b0 | 1'b0 | 2'b01 |
| 1'b1 | 1'b0 | 1'b1 | 1'b0 | 1'b1 | 1'b0 | 2'b11 |
| 1'b0 | 1'b1 | 1'b0 | 1'b1 | 1'b0 | 1'b1 | 2'b00 |

Fig. 10

| vco_gain_ctr[1:0] | {KVCO-X3,KVCO-X2,KVCO-X1} | MV2I-array |
|---|---|---|
| 00 | 001 | MV2I-A (MV2I-FF) |
| 01 | 010 | MV2I-B (MV2I-TT) |
| 10 | 100 | MV2I-C (MV2I-SS) |

Fig. 11

AUTOMATIC HYBRID OSCILLATOR GAIN ADJUSTOR CIRCUIT

CROSS-REFERENCE TO RELATED APPLICATIONS

This application claims priority to U.S. Provisional Application No. 63/219,866, filed Jul. 9, 2021, entitled "Systems and Methods for Automatic VCO Gain Adjustments," which is incorporated herein by reference in its entirety.

TECHNICAL FIELD

The technology described in this disclosure generally relates to phase locked loop circuits.

BACKGROUND

A phase locked loop (PLL) circuit is an electronic control circuit that generates an output clock signal having a phase that is locked to the phase of an input reference signal. For example, a PLL can be used to adjust an oscillator so that a frequency and phase of a signal generated by the oscillator matches the frequency and phase of a reference input signal. A PLL circuit is commonly used in communication devices, computers, and other electronic devices. An analog PLL circuit uses analog components to provide the phase lock architecture. By contrast, a PLL circuit may be implemented using all digital components. Hybrid PLL devices are provided that combine advantages of the digital controlled loop and the analog controlled loop. Operation of the hybrid PLL is separated into frequency tracking mode and a phase tracking mode.

The frequency tracking mode consists of discrete, coarse tuning of the hybrid PLL to match the frequency of the reference input signal and is performed by a digital controlled loop of the hybrid PLL. The digital controlled loop (DCL) of the hybrid PLL can provide fast tracking for reducing the locking time. On the other hand, the phase tracking mode is performed by an analog controlled loop of the hybrid PLL. The phase tracking mode consists of both phase tracking and fine frequency tuning to match the reference input signal. The analog controlled loop (ACL) of the hybrid PLL can provide very little, or no, quantization noise at steady state. By combining the DCL and ACL, the hybrid PLL can solve the problems with the large gain of a voltage-controlled oscillator (VCO) of an analog PLL (APLL), and the quantization noise caused by an all-digital PLL (ADPLL).

When the hybrid PLL is operating in phase tracking mode, the frequency tuning range of the hybrid PLL is limited due to a fixed supply voltage. However, temperature variation can cause frequency drifting of components of the hybrid PLL, prohibiting the analog control loop from tuning the VCO to match the frequency of a reference input signal. A solution is needed to allow the analog controlled loop to cover the entire specified frequency range of the device during operation in these temperature conditions.

BRIEF DESCRIPTION OF THE DRAWINGS

Aspects of the present disclosure are best understood from the following detailed description when read with the accompanying figures.

FIG. 10 is a table demonstrating how the different signals in the boundary checker and frequency range selection circuit correspond to different values of over_ana, under_ana, ud_band, and ov_band.

FIG. 11 is a table demonstrating how various fine tuning signals of an embodiment of the present disclosure correspond to variables used in an embodiment of the present disclosure.

DETAILED DESCRIPTION

Figure 1:
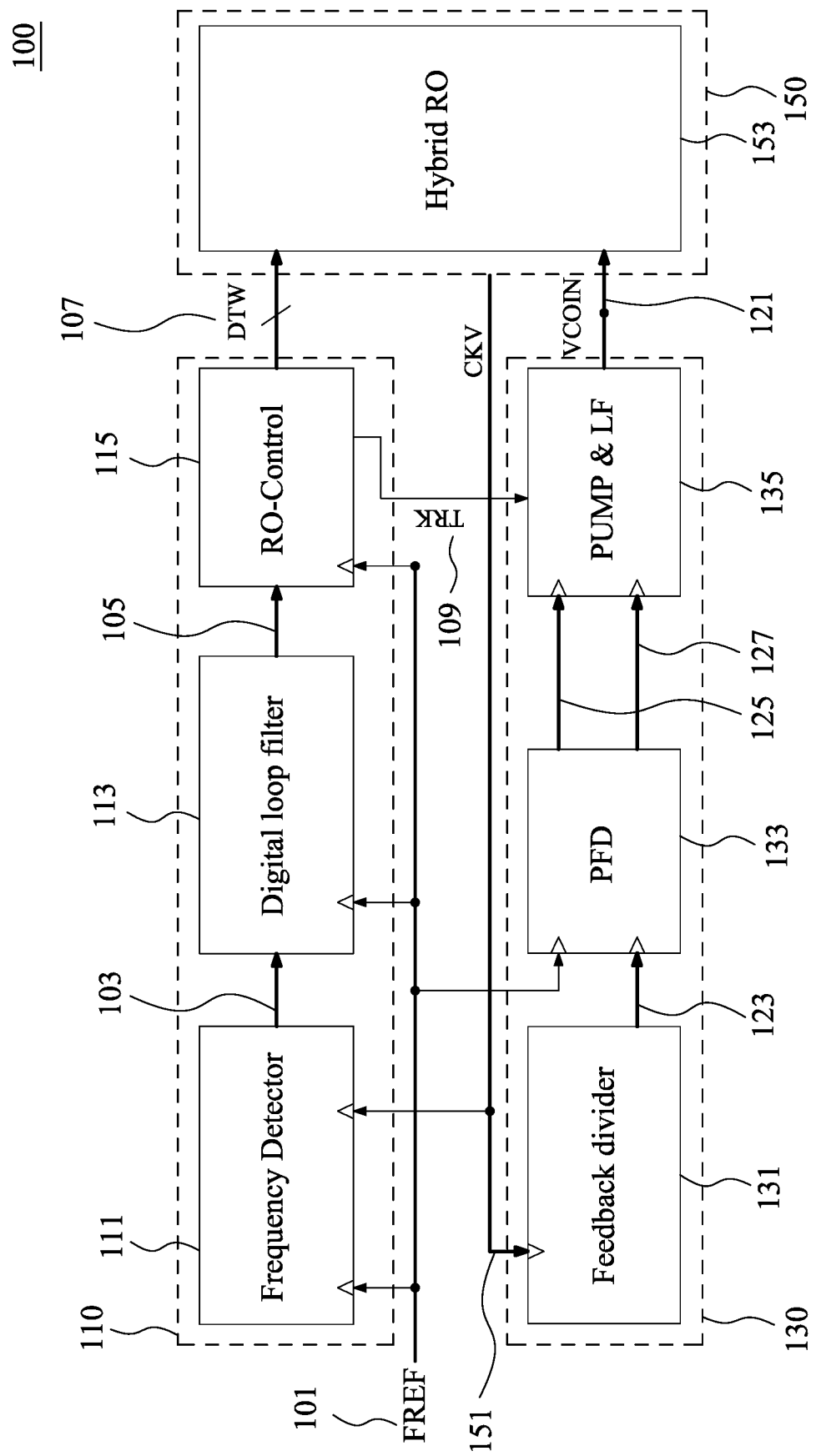
FIG. 1 is a block diagram of an exemplary hybrid phase lock loop (PLL).

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

A phase lock loop (PLL), such as a hybrid phase lock loop to provide an example, can be used to adjust its oscillator so that a frequency and/or a phase of an output signal generated by the oscillator is proportional to a frequency and/or a phase of a reference input signal. The PLL includes a phase and/or frequency detector that provides an error signal representing a difference, in frequency and/or phase, between the output signal and the reference input signal. This error signal can be measured to ensure that the frequency and/or the phase of the output signal is proportional to the frequency and/or the phase of the reference signal. For example, as the PLL adjusts the oscillator, the frequency and/or the phase of the output signal can gradually become closer to the frequency of the reference input signal. When the frequency and the phase of the output signal is proportional to the frequency and/or the phase of the reference input signal, the PLL is said to be locked onto the reference input signal. The time it takes for the frequency and/or phase of the output signal to become proportional to the frequency and/or the phase of the reference input signal can be referred to as the locking time.

In an example, the hybrid PLL operates in a frequency tracking mode to adjust the frequency of the output signal to be proportional to a frequency of the reference input signal, or, in a phase tracking mode to adjust a phase of the output signal to match any variations in the reference input signal. The frequency tracking mode is performed by a digital controlled loop of the hybrid PLL. The digital controlled loop (DCL) of the hybrid PLL can provide fast tracking for reducing the locking time. On the other hand, the phase tracking mode is performed by an analog controlled loop of the hybrid PLL. The analog controlled loop (ACL) of the hybrid PLL can provide very little, or no, quantization noise at steady state. By combining the DCL and ACL, the hybrid PLL can solve the problems with the large gain of a voltage-controlled oscillator (VCO) of an analog PLL (APLL), and the quantization noise caused by an all-digital PLL (ADPLL).

FIG. 1 is a block diagram of an exemplary hybrid PLL 100. A reference input signal 101 represents a first time-varying signal, such as a sine wave to provide some examples, having a frequency $f_{REF}$ and a phase $\phi_{REF}$. Similarly, an output signal 151 represents a second time-varying signal having a frequency $f_{OUT}$ and a phase $\phi_{REF}$. Herein, the frequency $f_{REF}$ and the phase $\phi_{REF}$ of the first time-varying signal is referred to as the $f_{REF}$ and the phase $\phi_{OUT}$, respectively. Similarly, the frequency $f_{OUT}$ and the phase $\phi_{OUT}$ of the second time-varying signal is referred to as the four and the phase $\phi_{OUT}$, respectively. Hybrid PLL 100 adjusts the output signal 151 such that the frequency for and/or the phase $\phi_{OUT}$ is proportional to the frequency $f_{REF}$ and/or the phase $\phi_{REF}$. Hybrid PLL 100 can operate in the frequency tracking mode to adjust the frequency $f_{OUT}$ to be proportional to the frequency $f_{REF}$ or in the phase tracking mode to adjust the phase $\phi_{OUT}$ to match, or substantially match, the phase $\phi_{REF}$.

Hybrid PLL 100 can be implemented using a frequency detector 111, a digital loop filter 113, an oscillator controller 115, a feedback divider 131, a phase frequency detector (PFD) 133, a charge pump and analog filter 135, and a hybrid oscillator 153.

The components of hybrid PLL 100 can be divided in three portions—DCL 110, ACL 130, and oscillator circuit 150. DCL 110 includes frequency detector 111, digital loop filter 113, and oscillator controller 115 and is configured to perform the frequency tracking mode of hybrid PLL 100. The components of DCL 110 can be implemented using digital components. DCL 110 is configured to generate a digital signal (digital tuning word 107) that controls hybrid oscillator 153 during the frequency tracking operation mode of the hybrid PLL.

In one example, ACL 130 includes feedback driver 131, phase frequency detector 133, and charge pump and analog filter 135 and is configured to perform the phase tracking mode of hybrid PLL 100. The components of ACL 130 can be implemented using analog components or using analog and digital components. For example, charge pump and filter 135 of ACL 130 can be implemented using analog components; and phase frequency detector 133 and feedback divider 131 of ACL 130 can be implemented using analog and/or digital components. ACL 130 is configured to generate an analog signal (output voltage 121 (VCOIN)) that controls hybrid oscillator 153 during the phase tracking operation mode of the hybrid PLL.

In this embodiment, oscillator circuit 150 of PLL 100 includes hybrid oscillator 153 and is configured to provide discrete frequency tuning in the frequency tracking mode and continuous frequency tuning in the phase tracking mode. In one example, hybrid oscillator 153 is implemented using analog components. The components of oscillator circuit 150 can be implemented using analog components. Alternatively, ACL 130 can include feedback divider 131 and phase frequency detector 133. In this example, charge pump and analog filter 135 can be included in oscillator circuit 150 with hybrid oscillator 153. In one embodiment of this example, oscillator circuit 150 can be implemented using analog components.

Frequency detector 111 receives input signal 101 and output signal 151. Frequency detector 111 compares the frequency $f_{OUT}$ of output signal 151 and the frequency $f_{REF}$ of input signal 101 to provide an error signal 103. In one example, frequency detector 111 is configured to convert at least one of output signal 151 and input signal 101 into digital signals before comparing the frequencies. Frequency detector 111 provides digital error signal 103. If error signal 103 is zero or close to zero, it indicates that the frequency $f_{OUT}$ of output signal 151 is tracking and/or is a multiple of the frequency $f_{REF}$ of input signal 101.

Digital loop filter 113 is configured to control the bandwidth of hybrid PLL 100 in DCL mode. Digital loop filter 113 receives error signal 103. Error signal 103 represents a digital representation of a third time-varying signal. In one example, digital loop filter 113 suppresses high frequency components in the third time-varying signal which are outside of its bandwidth to provide samples of a direct current (DC), or near DC, component of the third time-varying signal within its bandwidth as the signal 105.

Oscillator controller 115 receives signal 105 from digital loop filter 113 and reference input signal 101. Oscillator controller 115 is configured to analyze signal 105 and reference input signal 101 and generate digital tuning word 107 and tracking signal 109. During the frequency tracking mode where hybrid PLL 100 is using DCL 110, digital tuning word 107 is used to control the frequency of hybrid oscillator 153. In one example, oscillator controller 115 generates digital tuning word 107 by multiplying signal 105 by a normalization value ($NROM_{RO}=f_{REF}/Gain_{RO}$) to provide process effect cancellation. In one example, the tolerance of the normalization value for DCL can reach around +100%. Also, an incorrect normalization value can affect only tracking time and not stability of hybrid PLL 100. Oscillator controller 115 can also include a function of retiming to avoid frequency glitches when digital tuning words transition. Digital tuning word 107 is an input signal to hybrid oscillator 153 to tune the frequency of hybrid oscillator 153. DCL 110 of hybrid PLL 100 performs the frequency tracking mode by tuning digital tuning word 107. In one example, digital tuning word 107 can be a 5-bit binary code, which can provide a wide frequency tuning range.

In addition to generating digital tuning word 107, oscillator controller 115 controls the overall configuration and operation of hybrid PLL 100. Oscillator controller 115 configures hybrid PLL 100 to operate the frequency tracking mode using DCL 110. In the frequency tracking mode using DCL 110, oscillator controller 115 disables tracking signal 109 by setting tracking signal 109 to a first logical level (e.g., low logical level.) Hybrid oscillator 153 adjusts output signal 151 to adjust the frequency $f_{OUT}$ in the frequency tracking mode based on the received digital tuning word 107. Thereafter, oscillator controller 115 monitors signal 105 (which is created based on error signal 103) to determine a condition to switch to phase tracking mode. Once oscillator controller 115 detects the switching condition, oscillator controller 115 configures hybrid PLL 100 to operate in the phase tracking mode using ACL 130 (e.g., enables ACL 130) The switching condition indicates the frequency $f_{REF}$ is sufficiently close to the frequency $f_{OUT}$ to allow hybrid oscillator to lock onto reference input signal 101 in the phase tracking mode of operation using ACL 130.

In the phase tracking mode of operation using ACL 130, oscillator controller 115 enables tracking signal 109 by setting tracking signal 109 to a second logical level (e.g., high logical level.) Hybrid oscillator 153, using ACL 130, adjusts output signal 151 to adjust the phase $\phi_{OUT}$ in the phase tracking mode. When the phase component of the error signal output of phase frequency detector 133 is minimized, the phase $\phi_{OUT}$ is sufficiently close to the phase $\phi_{REF}$. In this situation, the hybrid oscillator is locked onto the reference input signal 101 so as to track any variations in the frequency $f_{REF}$ and the phase $\phi_{REF}$.

According to one example, oscillator controller 115 is configured to determine the switching condition by monitoring the signal 105 (which is created based on error signal 103) to determine a trend, for example, a positive trend, a flat trend, and/or a negative trend in signal 105. An example of this trend detection process is discussed in U.S. patent application Ser. No. 15/135,212, filed Apr. 5, 2016 and titled "Automatic Detection of Change in PLL Locking Trend," which is incorporated by reference in its entirety. The positive trend indicates a digital value of signal 105 is increasing from a previous value of signal 105, the flat trend indicates the digital value of signal 105 is substantially unchanged from the previous value of signal 105, and the negative trend indicates the digital value of signal 105 is decreasing from the previous value of signal 105. Once oscillator controller 115 detects a first change in the trend of signal 105, for example, from the positive trend to the flat trend or the negative trend to the flat trend, oscillator controller 115 configures hybrid PLL 100 to use ACL 130 to operate in the phase tracking mode.

Similarly, while hybrid PLL 100 is configured to use ACL 130 to operate in the phase tracking mode, oscillator controller 115 is configured to monitor the error signal 103 to determine whether a second change in the trend of the error signal occurs. The second change in trend can include a change from the flat trend to the positive trend or from a flat trend to the negative trend. The second change in the trend can indicate that the frequency of the output signal 151 is no longer sufficiently close to the frequency of the reference input signal 101. If oscillator controller 115 detects a second change in the trend of error signal 103, oscillator controller 115 configures hybrid PLL 100 to use DCL 110 to operate again in the frequency tracking mode.

According to some embodiments, ACL 130 includes feedback divider 131, phase frequency detector 133, and charge pump and analog filter 135. Before hybrid PLL 100 enters the phase tracking mode using ACL 130, tracking signal 109 is set to the first logical level (e.g., low logical level) and output voltage 121 (VCOIN) is set to a fixed voltage (e.g., VDD/2). Hybrid PLL 100 starts operating in the phase tracking mode using ACL 130 when oscillator controller 115 enables tracking signal 109 by setting tracking signal 109 to a second logical level (e.g., high logical level.)

Feedback divider 131 is a synchronous high speed divider driven by output signal 151. Feedback divider 131 receives output signal 151 and generates feedback signal 123. Phase frequency detector 133 receives feedback signal 123 and reference input signal 101. Phase frequency detector 133 is configured to detect the phase difference (and/or frequency difference) between feedback signal 123 and reference input signal 101. Phase frequency detector 133 generates two output signals with narrow pulse width (e.g., around 40 ps)—UP signal 125 and DN signal 127. The pulse signals UP signal 125 and DN signal 127 are input to charge pump and analog filter 135. Although FIG. 1 is described with the phase frequency detector 133, it is noted that other phase detectors/comparators can also be used.

Charge pump and analog filter 135 can include a charge pump and a loop filter. The charge pump of charge pump and analog filter 135 converts the UP signal 125 and DN signal 127 to a corresponding UP/DN current. The analog filter of charge pump and analog filter 135 converts the UP/DN current output of the charge pump into the output voltage 121 (VCOIN). Output voltage 121 (VCOIN) is input to hybrid oscillator 153. As discussed above, during the frequency tracking mode using DCL 110 of hybrid PLL 100, tracking signal 109 (which is input to charge pump and analog filter 135) is set to the first logical level (e.g., low logical level) and therefore, output voltage 121 (VCOIN) is set to a fixed voltage (e.g., VDD/2). When hybrid PLL 100 starts operating in the phase tracking mode using ACL 130, tracking signal 109 is set to a second logical level (e.g., high logical level) and output voltage 121 (VCOIN) is used for phase tracking. During the phase tracking mode using ACL 130, digital tuning word 107 is frozen.

Hybrid oscillator 153 is configured to receive digital tuning word 107 and output voltage 121 (VCOIN) and generate output signal 151. As discussed above, digital tuning word 107 (e.g., a 32 thermometer code) is used during the frequency tracking mode using DCL 110. Using digital tuning word 107 generated by DCL 110, hybrid oscillator 153 adjusts the frequency $f_{OUT}$ of output signal 151 to be in a range that is sufficiently close, or closer than before tuning, to the frequency $f_{REF}$ of reference input signal 101. On the other hand, output voltage 121 (VCOIN) is used during the phase tracking mode using ACL 130. In one example, output voltage 121 (VCOIN) is a continuous voltage in the tuning range of about 0.2 volts or 0.3 volts to VDD (e.g., the core supply voltage). Hybrid oscillator 153 fine tunes the frequency $f_{OUT}$ of output signal 151 and adjusts the phase $\phi_{OUT}$ of output signal 151 in accordance with output voltage 121 (VCOIN) generated by ACL 130 to track the frequency $f_{REF}$ and the phase $\phi_{REF}$ of reference input signal.

Figure 2:
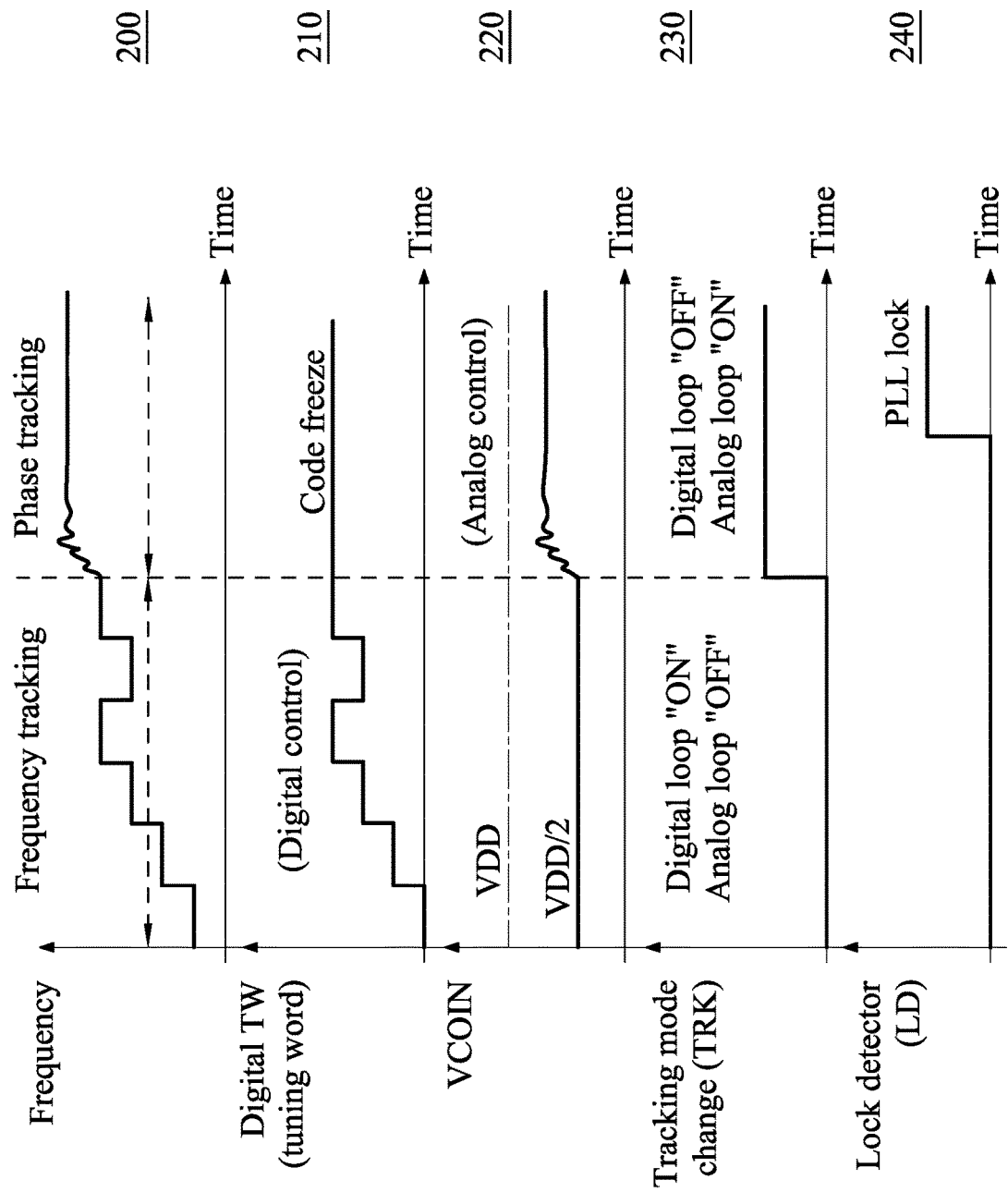
FIG. 2 illustrates timing diagrams for an exemplary hybrid PLL.

FIG. 2 illustrates timing diagrams for hybrid PLL 100, according to some embodiments of present disclosure. Graph 200 illustrates the frequency $f_{OUT}$ of output signal 151 versus time. As illustrated in graph 200, in the frequency tracking mode of graph 200, hybrid PLL 100 uses DCL 110 to track the frequency $f_{REF}$ of reference input signal 101. In the phase tracking mode of graph 200, hybrid PLL 100 uses ACL 130 to track the phase $\phi_{REF}$ of reference input signal 101. The phase tracking mode also includes fine tuning the frequency $f_{OUT}$ of output signal 151 such that hybrid PLL 100 tracks the frequency $f_{REF}$ and the phase $\phi_{REF}$ of reference input signal 101.

Graph 210 illustrates digital tuning word 107 versus time. During the frequency tracking mode of graph 210, digital tuning word 107 is adjusted by DCL 110 based on the difference between the frequency $f_{OUT}$ of output signal 151 and the frequency $f_{REF}$ of reference input signal 101. During the frequency tracking mode, the frequency $f_{OUT}$ of output signal 151 illustrated in graph 200, follows digital tuning word 107 as illustrated in graph 210. When the switch condition (switch between the frequency tracking mode of operation and the phase tracking mode of operation) is met, hybrid PLL 100 switches to the phase tracking mode using ACL 130. During the phase tacking mode of graph 210, digital tuning word 107 is fixed.

Graph 220 illustrates output voltage 121 (VCOIN) versus time. During the frequency tracking mode of operation, charge pump and analog filter 135 is disabled. Therefore, output voltage 121 (VCOIN) is kept at a fixed voltage. In one exemplary embodiment, the fixed voltage can be half of VDD (e.g., 0.38 volts.) However, the embodiments of this disclosure are not limited to this value. When hybrid PLL 100 switches from the frequency tracking mode using DCL 110 to the phase tracking mode using ACL 130, ACL 130 and charge pump and analog filter 135 are enabled. Accordingly, output voltage 121 (VCOIN) is adjusted by ACL 130 based on the difference between the phase $\phi_{OUT}$ of output signal 151 and the phase $\phi_{REF}$ of reference input signal 101. During the phase tracking operation mode, the output voltage of the analog controlled loop (VCOIN 121) tracks phase of the reference input signal.

Graph 230 illustrates tracking signal 109 versus time. In the frequency tracking mode of operation, tracking signal 109 is disabled by being set to the first logical level (e.g., low logical level.) In the phase tracking mode using ACL 130, oscillator controller 115 enables tracking signal 109 by setting tracking signal 109 to the second logical level (e.g., high logical level.) Graph 240 illustrates the locking time, when hybrid PLL 100 is locked onto the reference input signal. Lock occurs when the frequency and the phase of the output signal is proportional to the frequency and/or the phase of the reference input signal.

Figure 3A:
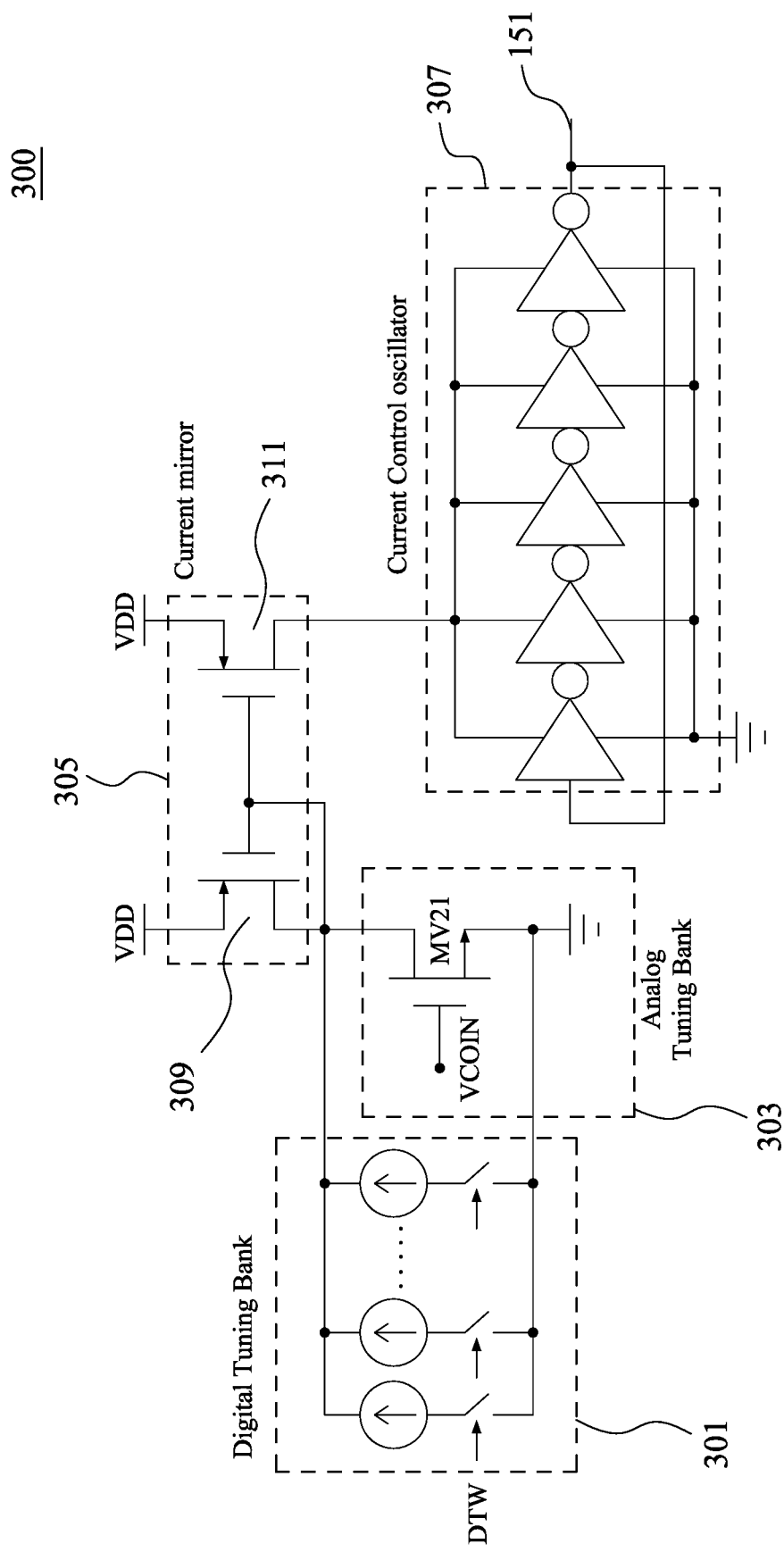
FIG. 3A is an exemplary implementation of a hybrid oscillator that can be implemented with a hybrid PLL, according to an embodiment of the present disclosure.

FIG. 3A illustrates an exemplary implementation of a hybrid oscillator that can be implemented with hybrid PLL 100, according to an embodiment of the present disclosure. In one example, hybrid oscillator 300 of FIG. 3A can be an implementation of hybrid oscillator 153 of FIG. 1. Hybrid oscillator 300 can be implemented using a digital tuning bank (DTB) 301, an analog tuning bank (ATB) 303, a current mirror 305, and a current controlled oscillator 307.

Digital tuning bank 301 includes one or more current sources and one or more switches. Each current source of digital tuning bank 301 is connected to a switch in series that constructs one digital tuning bit of digital tuning bank 301. The digital tuning bits are connected to each other in parallel. The switch of each digital tuning bit of bank 301 is controlled by the digital tuning word. The digital tuning word can include digital tuning word 107 of FIG. 1. Digital tuning bank 301 can be configured to provide a wide frequency tuning range. According to one example, the frequency tuning range of the digital tuning bank 301 can be divided into 32 steps using 32 of 5-bits binary codes. For example, a frequency range of 2.4 GHz can be divided into 32 steps each with a step size of 75 MHz. It is noted that other frequency ranges and/or other number of steps can also be used. According to one example digital tuning word 107 can be a thermometer code that controls digital tuning bank 301. A thermometer code can represent a natural number, N, with N ones followed by a zero (if the natural number is understood as non-negative integer) or with N−1 ones followed by a zero (if natural number is understood as strictly positive integer). In this example, the number of current sources of digital tuning bank 301 can be equal to the number of steps in the frequency range.

Analog tuning bank 303 can be implemented by a metal-oxide-semiconductor field-effect transistor (MOSFET) such as, but not limited to, a n-channel MOSFET. In one example, the transistor of analog tuning bank 303 has a gate terminal that receives the analog signal output voltage 121 (VCOIN) of FIG. 1. In this example, the source terminal of the transistor of analog tuning bank 303 can be coupled to a low voltage (such as ground) and also to digital tuning bank 301. The drain terminal of the transistor of analog tuning bank 303 can be coupled to current mirror 305 and also to digital tuning bank 301. Analog tuning bank 303 is configured to operate during the phase tracking mode of the hybrid PLL 100 using ACL 130 and is configured to convert output voltage 121 (VCOIN) to an output current. Analog tuning bank 303 provides a continuous and fine tuning mechanism to the hybrid PLL 100. In one example (as discussed in more detail with respect to FIG. 3B), analog tuning bank 303 provides a 750 MHz tuning range for a 0.25 volt tuning voltage. ACL 130 and analog tuning bank 303 perform the phase tracking mode of the hybrid PLL 100, and therefore, very small or no quantization noise is introduced in the steady state operation of the hybrid PLL 100 as usually seen in ADPLLs. It is noted that the illustrated analog tuning bank 303 is presented as an example, and other analog tuning bank circuits can also be used.

Hybrid oscillator 300 further includes a current mirror 305. On one side, current mirror 305 is coupled to digital tuning bank 301 and analog tuning bank 303. On the other side, current mirror 305 is coupled to current controlled oscillator (CCO) 307. Current mirror 305 is configured to combine the currents of digital tuning bank 301 and analog tuning bank 303 and to drive CCO 307. In a non-limiting example, current mirror 305 can include two p-channel MOFSETs 309 and 311. In this example, source terminals of transistors 309 and 311 are coupled to VDD. Drain and gate terminals of transistor 309 are coupled to each other and also coupled to digital tuning bank 301 and analog tuning bank 303 (e.g., to drain of the transistor of analog tuning bank 303.) The gate terminals of transistors 309 and 311 are coupled to each other, and the drain terminal of transistor 311 is coupled to CCO 307. It is noted that the implementation of current mirror 305 in FIG. 3A is an exemplary implementation and other implementations (e.g., active current mirror, high power supply rejection ratio (PSRR) active current mirror, wide-swing current mirrors, Wilson current mirror, etc.) also can be used.

Hybrid oscillator 300 also includes current controlled oscillator (CCO) 307. CCO 307 can include a ring oscillator and can be implemented using single-ended or differential multi-stages. CCO 307 is coupled to current mirror 305. Current mirror 305 is configured to control CCO to generate output signal 151 by controlling the amount of current supplied to CCO 307. Generally, the frequency of CCO 307 will increase with increasing current supply from current mirror 305. When hybrid PLL 100 operates in the frequency tracking mode using DCL 110, digital tuning word 107 controls digital tuning bank 301, which in turn controls CCO 307 through current mirror 305. When hybrid PLL 100 operates in the phase tracking mode using ACL 130, output voltage 121 (VCOIN) controls analog tuning bank 303, which in turn controls CCO 307 through current mirror 305.

Figure 3B:
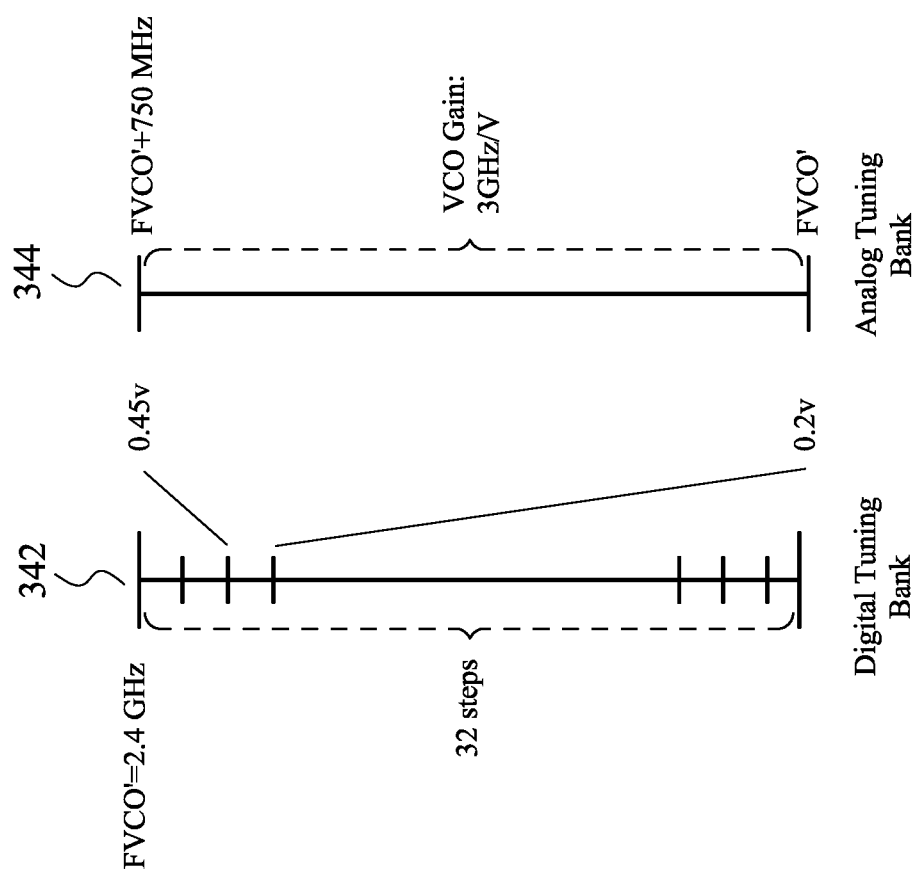
FIG. 3B is a frequency arrangement, according to an embodiment of the present disclosure.

FIG. 3B illustrates a frequency arrangement 340, according to an embodiment of the present disclosures. Frequency arrangement 340 of FIG. 3B illustrates a frequency range 342 that is covered by digital tuning bank 301 of FIG. 3A and a frequency range 344 covered by analog tuning bank 303 of FIG. 3A. It is noted that the frequency arrangement 340 is an exemplary arrangement and any other frequency arrangement can be used.

In the exemplary arrangement of FIG. 3B, the digital tuning bank 301 can have a frequency range of 2.4 GHz. In this example, the step size of digital tuning bank is determined by the frequency range of analog tuning bank divided by a constant (e.g., 10 in this example) The constant 10 in this example is a covering ratio of frequency range of analog tuning bank to step size of digital tuning bank. In other words, the frequency range of analog tuning bank covers times of a step size of digital tuning bank. In the example of FIG. 3B, the frequency range 2.4 GHz of digital tuning bank 10 is divided into 32 steps (e.g., thermometer code input to hybrid oscillator 115.) Therefore, each step in the frequency range of digital tuning bank is a 75 MHz step size. Each step in the frequency range of digital tuning bank corresponds to a fraction of the frequency range of the analog tuning bank. Considering the constant 10 discussed above, the frequency range of analog tuning bank would be 750 MHz. Given a voltage range of 0.25 volts (from 0.2 volts to 0.45 volts) for the analog tuning bank, the VCO gain of the analog tuning bank would be 3 GHz/V.

The frequency arrangement of FIG. 3B can be summarized in three equations. The first equation is that the frequency range of analog tuning bank is equal to the gain of VCO multiplied by the voltage range. The second equations is that the step size of digital tuning bank is equal to the frequency range of analog tuning bank divided by a constant (e.g., a covering ratio—for example 10 in the example above.) The third equation is that the number of steps of the digital tuning bank is equal to the frequency range of digital tuning bank divided by a step size of digital tuning bank. In one example, gain of VCO, voltage range, and frequency range of digital tuning bank are known values, from, for example, design specifications. Accordingly, the frequency range of the analog tuning bank, the step size of the digital tuning bank, and the number of steps of the digital tuning bank can be calculated using the equations discussed above.

Frequency drifting occurs in both the digital tuning bank 342 and analog tuning bank 344. Frequency drifting may occur, for example, at the "SS" process corner of the hybrid oscillator, as understood by one skilled in the art. In an example, the voltage range of the analog tuning bank 344 is 0.3 V, and the target frequency of the VCO is 4 GHz. If the VCO is operating in the "TT" process corner, as understood by one skilled in the art, the frequency range of the digital tuning bank 342 may be 0.4 GHz (3.8 GHz to 4.2 GHz). The gain of the VCO, therefore, would be 1.33 GHz/V. However, if the VCO is operating in the "SS" process corner, the frequency range of the digital tuning bank 342 may decrease to 0.2 GHz (3.9 GHz to 4.1 GHz) due to frequency drifting. The gain of the VCO at the "SS" process corner, therefore, would be 0.67 GHz/V.

Figure 4:
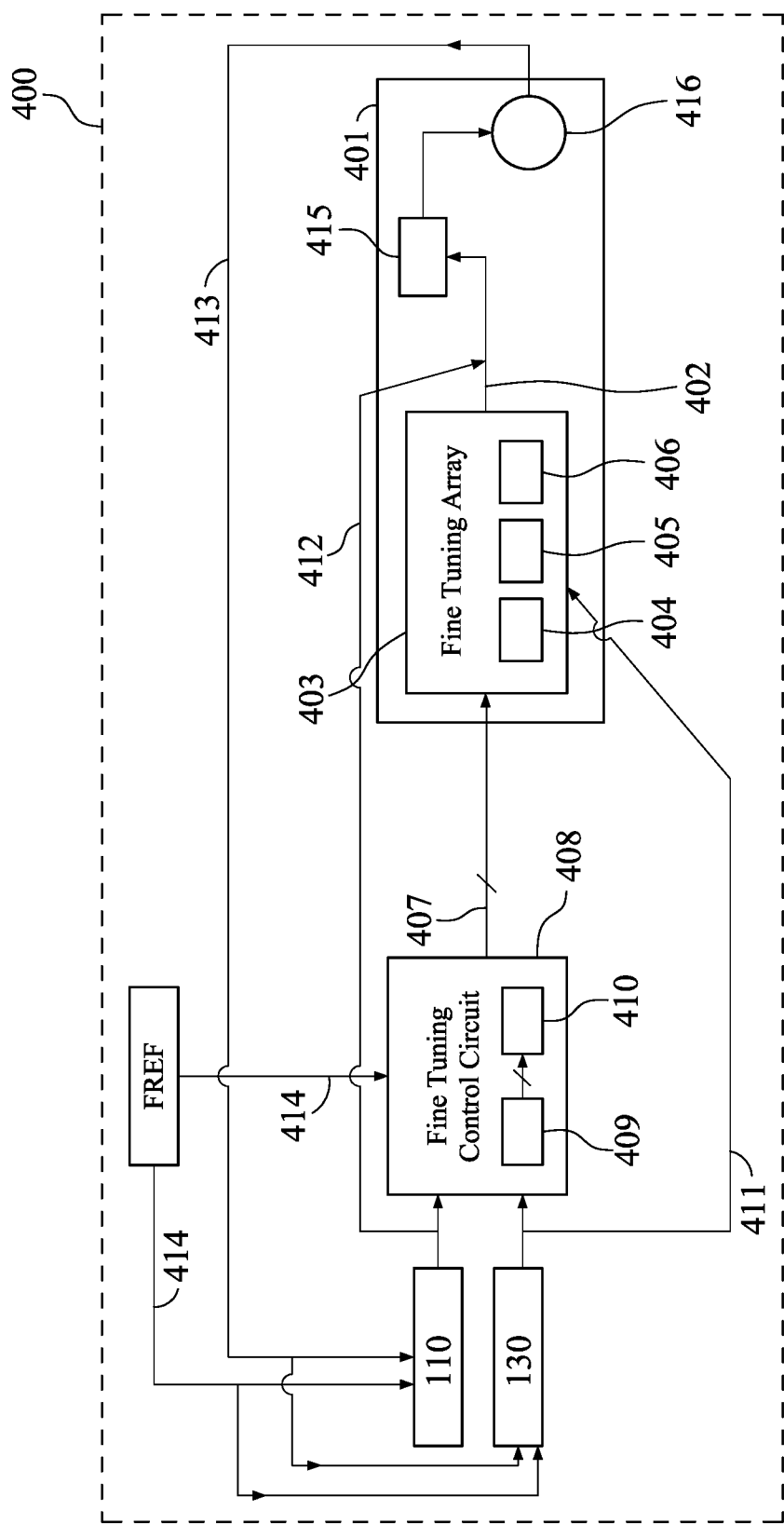
FIG. 4 is a diagram of an exemplary automatic hybrid oscillator gain adjustor circuit, according to an embodiment of the present disclosure.

FIG. 4 is a diagram of an exemplary automatic hybrid oscillator gain adjustor circuit, according to an embodiment of the present disclosure. The automatic hybrid oscillator gain adjustor circuit of the present disclosure is implemented in a hybrid phase lock loop (PLL) 400 and includes a fine tuning control circuit 408 and a hybrid oscillator 401. The hybrid oscillator 401 is configured to receive one or more fine tuning selection signals 407 from the fine tuning control circuit 408, a coarse tuning signal 412 from the digital control loop (DCL) 110, and a fine tuning signal 411 from the analog control loop 130. The hybrid oscillator 401 is further configured to generate an output signal having a frequency $f_{OUT}$ 413.

In one example, hybrid oscillator 401 includes a fine tuning array 403, a current mirror 415, and a ring oscillator 416. The one or more fine tuning selection signals 407 and the fine tuning signal 411 can be received at the fine tuning array 403 of the hybrid oscillator 401. The fine tuning array 403 may be configured to generate one or more gain adjustment signals 402. This gain adjustment signal, together with coarse tuning signal 412, are received at a current mirror 415. The current mirror is coupled to ring oscillator 416, which generates an output signal with frequency $f_{OUT}$ 413. The fine tuning control circuit 408 is configured to receive an input reference signal 414, a fine tuning signal 411 from the analog control loop (ACL) 130, and a coarse tuning signal 412 from the DCL 110 and generate one or more fine tuning selection signals 407.

In one example embodiment, the fine tuning array 403 includes a first gain adjustment circuit 404 that is used to produce the gain adjustment signal 402 when the hybrid oscillator 401 is operating in a lower frequency range, a second gain adjustment circuit 405 that is used to produce the gain adjustment signal 402 when the hybrid oscillator 401 is operating in a normal frequency range, and a third gain adjustment circuit 406 that is used to produce the gain adjustment signal 402 when the hybrid oscillator 401 is operating in an upper frequency range. When the hybrid oscillator 401 is operating in the upper frequency range, the hybrid oscillator 401 produces an output signal with frequency $f_{OUT}$ 413 corresponding to that upper frequency range. This output signal is received by both the ACL 130 and DCL 110. The DCL 110 then produces coarse tuning signal 412, which is received as an input to the fine tuning control circuit 408. Similarly, the ACL 130 generates fine tuning signal 411, which is received as an input to the fine tuning control circuit 408. The fine tuning control circuit 408 includes both a boundary checker 409 and a frequency range selection circuit 410. The coarse tuning signal 412 from the DCL 110 and the fine tuning signal 411 from the ACL 130 are first received by the boundary checker 409 as inputs. After receiving the coarse tuning signal 412 and fine tuning signal 411 as inputs, the boundary checker 409 produces signals corresponding to the operating frequency range of the hybrid oscillator 401. These signals 628 and 629 can be seen in the detailed implementation of the boundary checker 409 shown in FIG. 6. These signals 628 and 629 corresponding to the operating frequency range of the hybrid oscillator 401 are received as an input to the frequency range selection circuit 410. The frequency range selection circuit 410 then produces one or more fine tuning selection signals 407. The one or more fine tuning selection signals 407 is received as an input to the fine tuning array 403 within the hybrid oscillator 401. After receiving the one or more fine tuning selection signals 407 from the frequency range selection circuit 410, the fine tuning array 403 generates a gain adjustment signal 402.

When the one or more fine tuning selection signals 407 corresponds to an operation of the hybrid oscillator 401 in a lower frequency range, the fine tuning array 403 couples the first gain adjustment circuit 404 to the current mirror 415. The fine tuning array 403 couples the first gain adjustment circuit 404 to the current mirror 415 during a lower frequency range operation because the lower frequency range operation corresponds to an "FF" process corner of the hybrid oscillator 401, as understood by one skilled in the relevant art. The first gain adjustment circuit 404 is a device that is used to decrease the gain of the hybrid oscillator 401. During operation in the "FF" process corner, the gain of the hybrid oscillator 401 is decreased because of frequency shifting at the "FF" process corner in which the hybrid oscillator 401 could not otherwise encompass the lowest frequency range specified by the hybrid PLL 400.

When the one or more fine tuning selection signals 407 corresponds to an operation of the hybrid oscillator 401 in a normal frequency range, the fine tuning array 403 couples the second gain adjustment circuit 405 to the current mirror 415. The fine tuning array 403 couples the second gain adjustment circuit 405 to the current mirror 415 during a normal frequency range operation because the normal frequency range operation corresponds to a "TT" process corner of the hybrid oscillator 401, as understood by one skilled in the relevant art. The second gain adjustment circuit 405 is a device that is used to maintain the prior gain of the hybrid oscillator 401. During operation in the "TT" process corner, the gain of the hybrid oscillator 401 is maintained because at this frequency range the hybrid oscillator 401 can encompass the specified frequency range of the hybrid PLL 400.

When the one or more fine tuning selection signals 407 corresponds to an operation of the hybrid oscillator 401 in an upper frequency range, the fine tuning array 403 couples the third gain adjustment circuit 406 to the current mirror 415. The fine tuning array 403 couples the third gain adjustment 406 circuit to the current mirror 415 during an upper frequency range operation because the upper frequency range operation corresponds to an "SS" process corner of the hybrid oscillator 401, as understood by one skilled in the relevant art. The third gain adjustment circuit 406 is a device that is used to increase the gain of the hybrid oscillator 401. During operation in the "SS" process corner, the gain of the hybrid oscillator 401 is increased because of frequency shifting at the "SS" process corner in which the hybrid oscillator 401 could not otherwise encompass the highest frequency range specified by the hybrid PLL 400.

Figure 5:
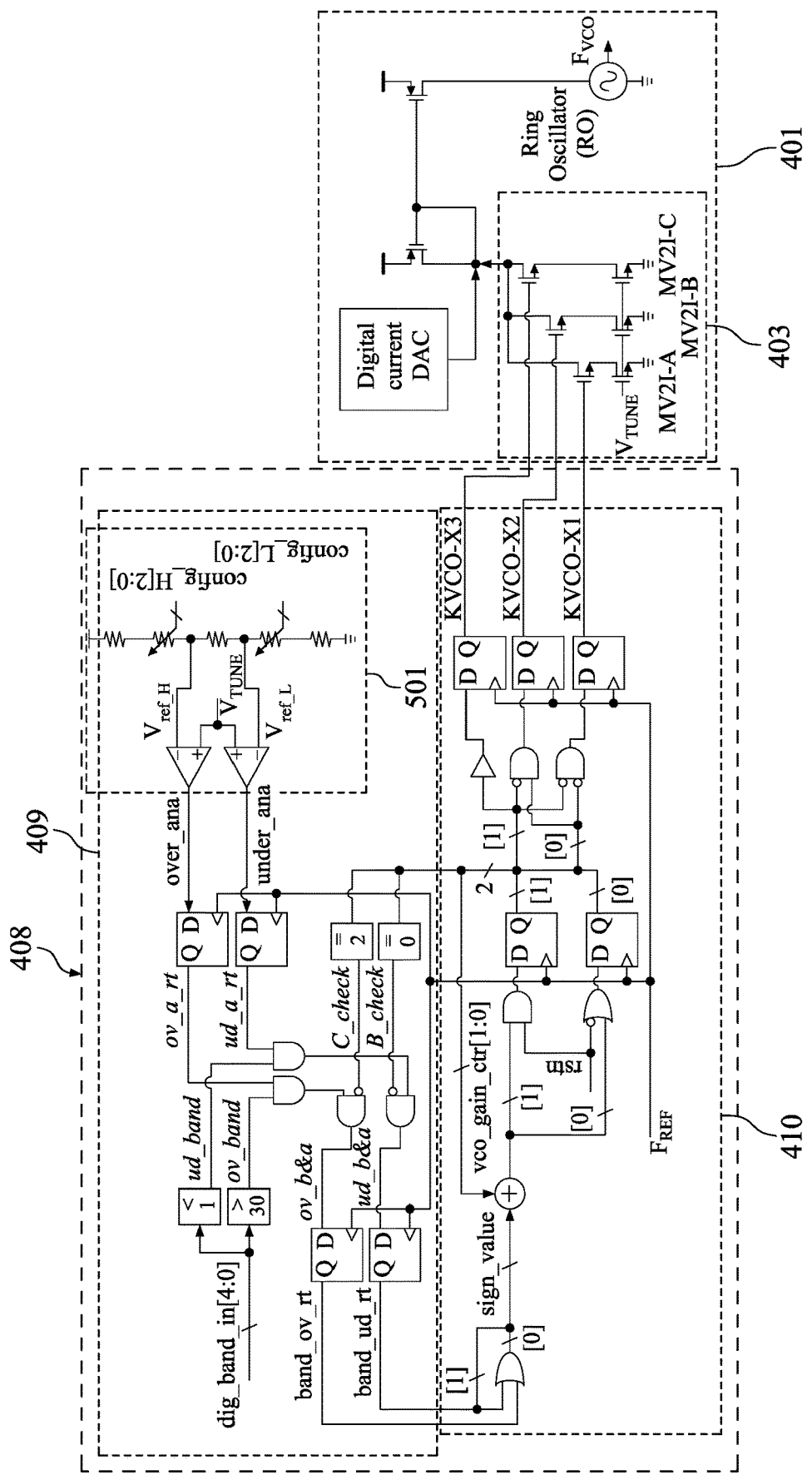
FIG. 5 is a diagram of a detailed implementation of an exemplary automatic hybrid oscillator gain adjustor circuit, according to an embodiment of the present disclosure.
Figure 6:
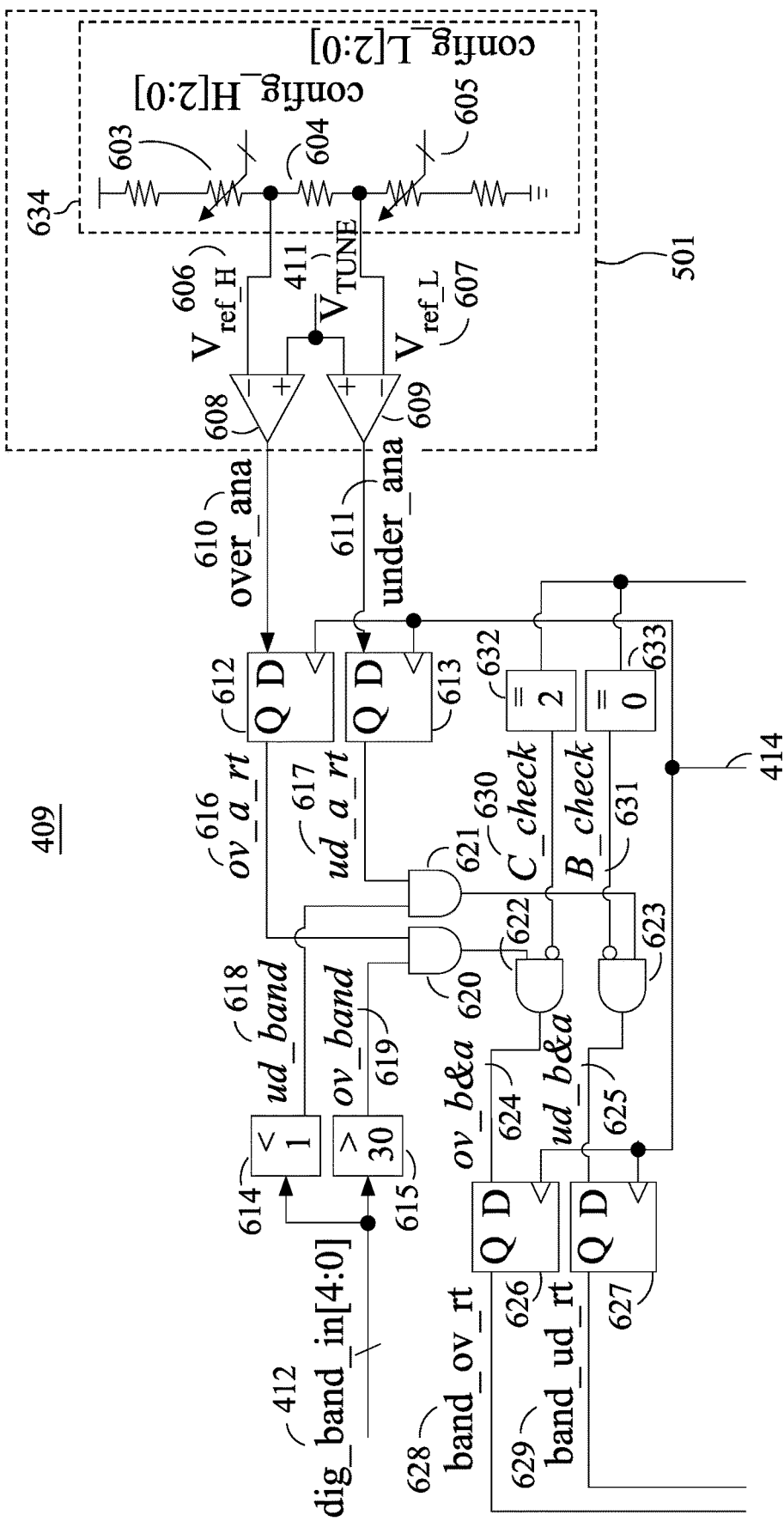
FIG. 6 is a diagram of a detailed implementation of an exemplary boundary checker, according to an embodiment of the present disclosure.
Figure 7:
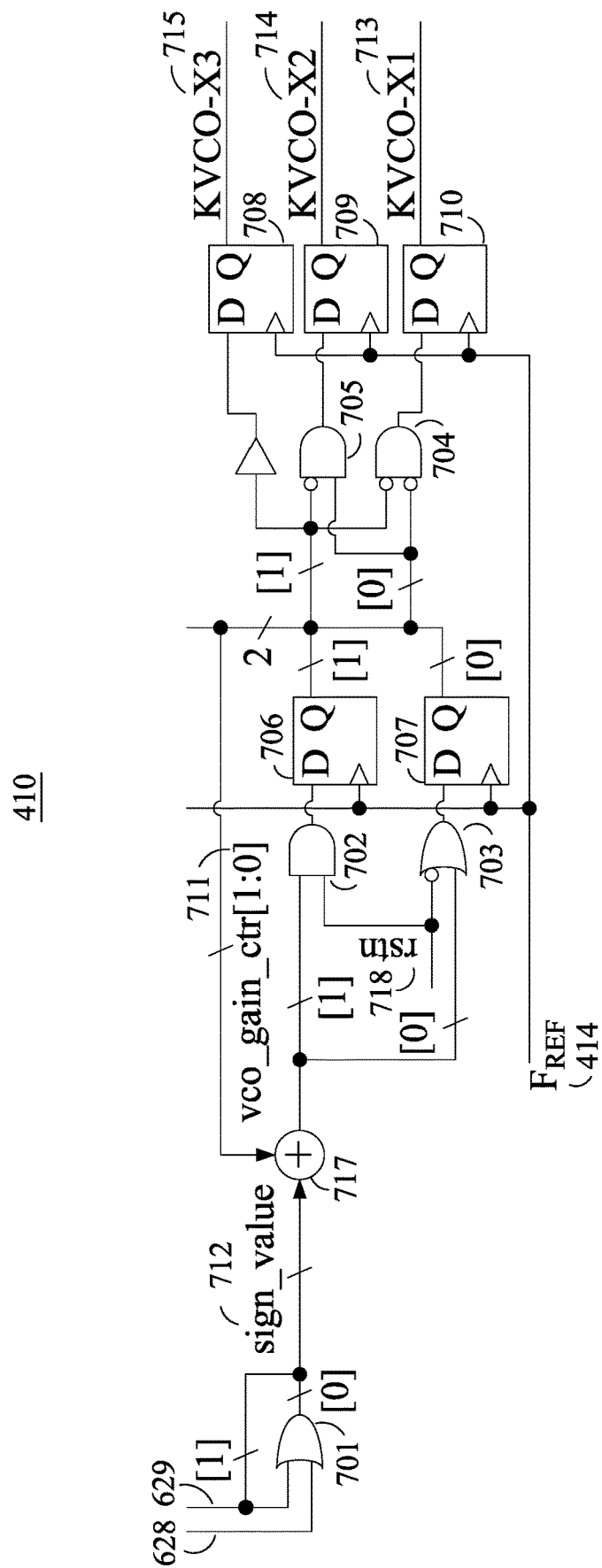
FIG. 7 is a diagram of a detailed implementation of a frequency range selection circuit, according to an embodiment of the present disclosure.
Figure 8:
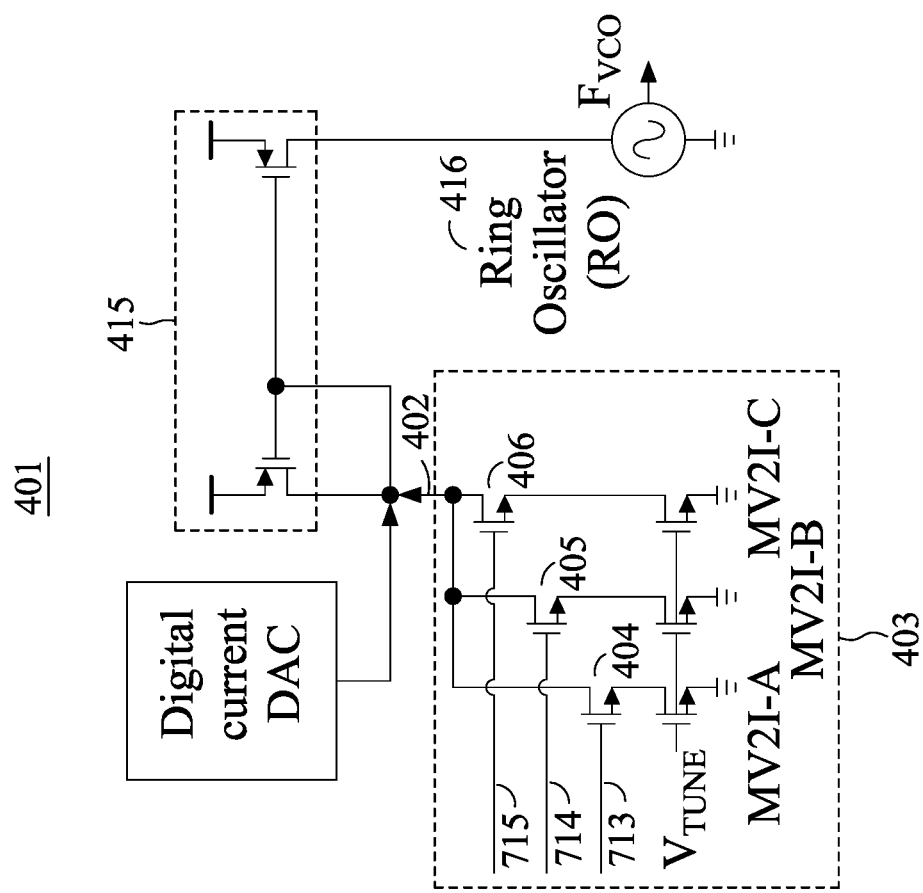
FIG. 8 is a diagram of a detailed implementation of a fine tuning array, according to an embodiment of the present disclosure.

FIG. 5 is a diagram of a detailed implementation of an exemplary automatic hybrid oscillator gain adjustor circuit. The fine tuning control circuit 408 can be implemented using various electrical components. FIG. 5 shows an example embodiment of how boundary checker 409, frequency range selection circuit 410, and hybrid oscillator 401 can be implemented with specific electrical components. FIGS. 6, 7, and 8 show individual detailed implementations of the boundary checker 409, frequency range selection circuit 410, and the hybrid oscillator 401, respectively.

FIG. 6 is an example embodiment of the boundary checker 409. In one embodiment, the boundary checker 409 includes a voltage range detector 501, a first latch 612, a second latch 613, a third latch 626, a fourth latch 627, a first digital comparator 614, a second digital comparator 615, a third digital comparator 632, a fourth digital comparator 633, a first logic gate 620, a second logic gate 621, a third logic gate 622, and a fourth logic gate 623. The voltage range detector 501 further comprises a voltage divider 634, a first amplifier 608, and a second amplifier 609. In one example, the first amplifier 608 and second amplifier 609 are operational amplifiers and serve as analog comparators. The voltage divider includes series resistors 603, 604, and 605 to generate a high analog reference voltage 606 and a low analog reference voltage 607. The voltage range detector 501 can receive the fine tuning signal 411 of the hybrid oscillator 401 as an input to the positive terminals of both the first amplifier 608 and the second amplifier 609. The negative terminal of the first amplifier 608 represents a high analog reference voltage and is coupled to the end of a resistor 603 in the voltage divider 634 representing a high analog voltage. The output of the first amplifier 608 of the voltage range detector 501 is enabled when the fine tuning signal 411 exceeds an analog voltage range. The negative terminal of the second amplifier 609 of the voltage range detector 501 represents a low analog reference voltage and is coupled to the end of a resistor 605 in the voltage divider 634 representing a low voltage. The output of this second amplifier 609 is enabled when the hybrid oscillator tuning voltage 602 drops below the analog voltage range.

Figure 9:
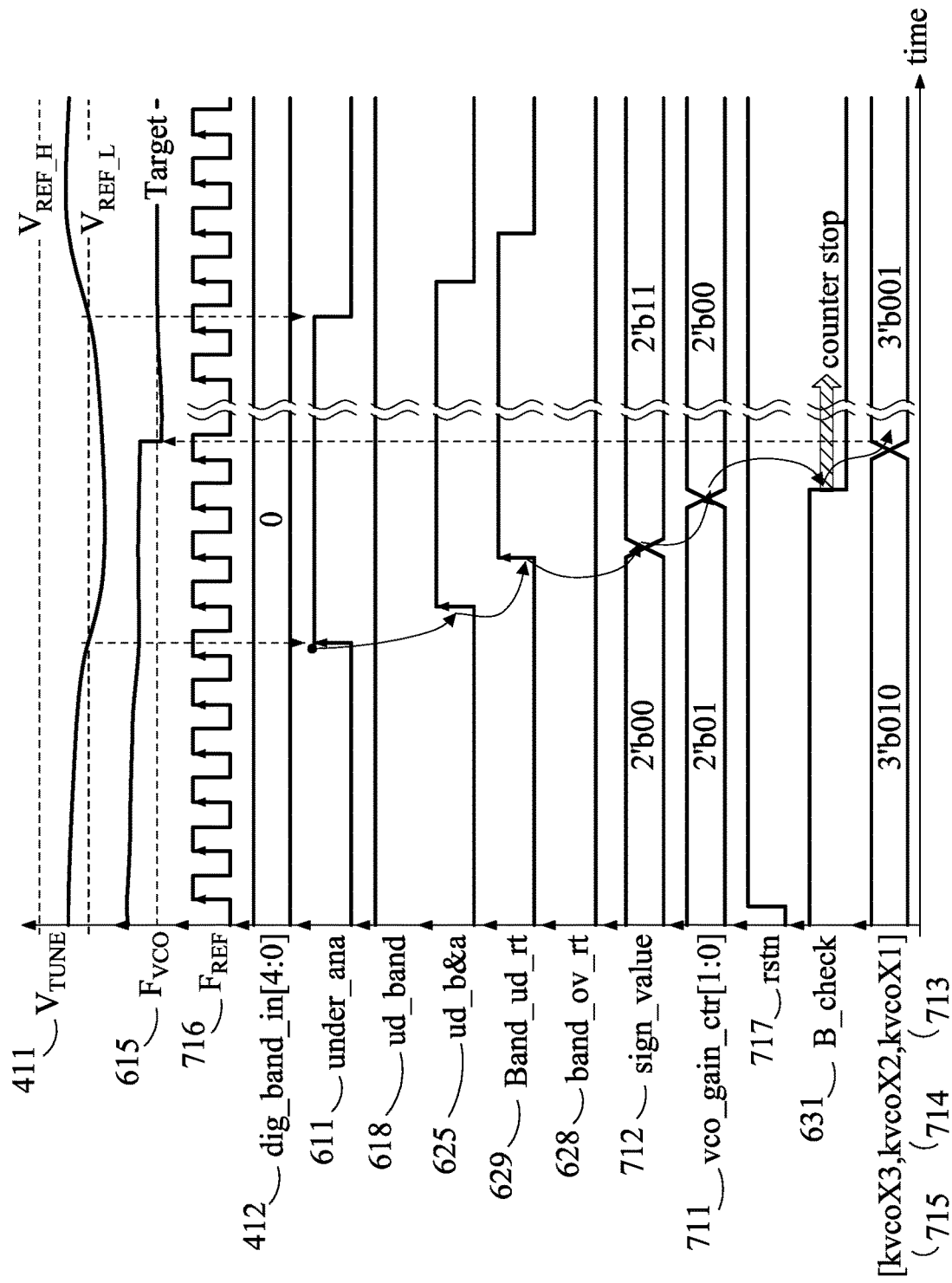
FIG. 9 is a timing diagram of an exemplary automatic hybrid oscillator gain adjustor circuit, according to an embodiment of the present disclosure.

Operation of the detailed implementation of an exemplary automatic hybrid oscillator gain adjustor circuit can be understood when discussed in conjunction with the timing diagram of FIG. 9. In the example demonstrated in FIG. 9, the tuning voltage of the hybrid oscillator (e.g., the fine tuning signal) 411 decreases to a level that is below the low analog reference voltage of the voltage range detector 501. At the next "high" level of the reference input signal 716, the analog signal corresponding to a lower frequency range of the hybrid oscillator under_ana 611 is enabled.

Returning to FIG. 6, in one embodiment the boundary checker 409 can receive the coarse tuning signal dig_band_in[4:0] 412 from the DCL 110 as an input to a first digital comparator 614 and a second digital comparator 615. The coarse tuning signal 412 is received at a first digital comparator 614 that compares the coarse tuning signal 412 to a low pre-determined value. The output of the first digital comparator 614, ud_band 618, is enabled when the coarse tuning signal is below the pre-determined value. The coarse tuning signal 412 is also received at a second digital comparator 615 that compares the coarse tuning signal 412 to a high pre-determined value. The output 619 of the second digital comparator 615 is enabled when the coarse tuning signal 412 is above the pre-determined value.

When both the output of the first digital comparator ud_band 618 is enabled and the fine tuning signal VTUNE 411 drops below an analog voltage range, a signal corresponding to an operation in the lower frequency range band_ud_rt 629 will be enabled and serve as an input to the frequency range selection circuit 410. This process is further demonstrated in the timing diagram of FIG. 9. When the tuning voltage of the hybrid oscillator VTUNE 411 decreases below an analog voltage range, the analog signal corresponding to the lower frequency range under_ana 611 is enabled. When the coarse tuning signal dig_band_in[4:0]

412 is below a pre-determined value, the output of the digital comparator ud_band 618 that compares the coarse tuning signal dig_band_in[4:0] 412 to the low pre-determined value is enabled. When both ud_band 618 and under_ana 611 are enabled, a signal ud_b&a 625 is enabled that corresponds to a determination that the hybrid oscillator 401 is operating in a lower frequency range and that the tuning voltage of the hybrid oscillator 411 has dropped below the pre-determined voltage range. After ud_b&a 625 is enabled, a signal corresponding to an operation in the lower frequency range band_ud_rt 629 is enabled and will serve as an input to the frequency range selection circuit 410.

FIG. 6 demonstrates how a determination that the hybrid oscillator 401 is operating in an upper frequency range is implemented in an embodiment of the present disclosure. An reference input signal fREF 414 serves as the "clock" input to each latch (e.g., D flip flops), as understood by one skilled in the relevant art. The input (D) of a first latch 612 is coupled to the output of the first amplifier 608 of the voltage range detector 501. Thus, when both the frequency of the reference input signal fREF 414 is at a "high" level and the output of the first amplifier over_ana 610 is enabled, the output (Q) of the first latch ov_a_rt 616 is enabled. This output (Q) of the first latch is coupled to one input of a first logic (AND) gate 620. The second input of the first logic gate 620 is coupled to the output 619 of the second digital comparator 615 with the higher pre-determined value. Thus, the output of the first logic (AND) gate 620 is enabled when both the coarse tuning signal dig_band_in[4:0] 412 corresponds to an upper frequency operating range and the fine tuning signal VTUNE 411 exceeds an analog voltage range.

The output of the first logic gate 620 serves as an input to a third logic (AND) gate 622. The output of the third logic gate 622 is enabled when the coarse signal dig_band_in[4:0] 412 corresponds to an upper frequency range operation of the hybrid oscillator 401, the fine tuning signal $V_{TUNE}$ 411 exceeds an analog voltage range, and a variable C_check 630 is enabled to ensure selection of the proper gain adjustment circuit, as discussed further below. The output of the third logic gate ov_b&a 624 is coupled to the input (D) of a third latch (e.g., a D flip flop) 626. The reference input signal $f_{REF}$ 414 is also coupled to the "clock" input of the third latch 626. Thus, the output (Q) of this latch band_ov_rt 628 is enabled when the third logic gate 622 is enabled and when the reference input signal $f_{REF}$ 414 is at a "high" level. This latch output band_ov_rt 628 is coupled to an input node of the frequency range selection circuit 410.

FIG. 6 also demonstrates how a determination that the hybrid oscillator is operating in a lower frequency range is implemented in an embodiment of the present disclosure. The input (D) of the second latch 613 is coupled to the output of the second amplifier 609 of the voltage range detector 501 corresponding to a lower frequency operation of the hybrid oscillator 401. The input reference signal 414 is coupled to the "clock" input of the second latch 613. Thus, when both the input reference signal 414 is at a "high" level and the output of the second amplifier 609 is enabled, the output (Q) of the second latch ud_a_rt 617 is enabled. This output (Q) 617 of the second latch 613 is coupled to one input of a second logic (AND) gate 621. The second input of the second logic gate 621 is coupled to the output of the first digital comparator 614 with the lower pre-determined value. Thus, the output of the second logic (AND) gate 621 is enabled when both the coarse tuning signal dig_band_in [4:0] 412 corresponds to a low frequency operating range and the fine tuning signal VTUNE 411 drops below an analog voltage range.

The output of the second logic gate 621 serves as an input to a fourth logic (AND) gate 623. The output of the fourth logic gate 623 is enabled when the coarse signal dig_band_in[4:0] 412 corresponds to a lower frequency range operation of the hybrid oscillator 401, the fine tuning signal $V_{TUNE}$ 411 drops below an analog voltage range, and a variable B_check 631 is enabled to ensure selection of the proper gain adjustment circuit, as discussed further below. The output of the fourth logic gate ud_b&a 625 is coupled to the input (D) of a fourth latch 627 (e.g., a D flip flop). The reference input signal $f_{REF}$ 414 is also coupled to the "clock" input of the fourth latch 627. Thus, the output (Q) band_ud_rt 629 of this latch is enabled when the fourth logic gate 623 is enabled and when the reference input signal $f_{REF}$ 414 is at a "high" level. This "Q" output 629 is coupled to an input node of the frequency range selection circuit 410.

FIG. 7 shows a detailed implementation of a frequency range selection circuit 410, according to an embodiment of the present disclosure. In one embodiment, the frequency range selection circuit 410 includes a first logic (OR) gate 701, a second logic (AND) gate 702, a third logic (OR) gate 703, a fourth logic (AND) gate 705, a fifth logic (AND) gate 704, a first latch (e.g., a D flip flop) 706, a second latch 707, a third latch 710, a fourth latch 709, a fifth latch 708, and an adder 717. The frequency range selection circuit 410 receives both the input corresponding to an upper frequency range operation band_ov_rt 628 and the input corresponding to a lower frequency range operation band_ud_rt 629. Both of these signals serve as inputs to a the first logic (OR) gate 701. The signal corresponding to a lower frequency range operation band_ud_rt 629 serves as an input to the first logic gate 701 and is also coupled to the output of the first logic gate 701. In the embodiment of the present disclosure, band_ud_rt 629 serves as the [1] element and the most significant bit in the two-element signal sign_value 712. The [0] element of the two-element signal sign_value 712 is the output of the first logic gate 701.

The sign_value signal 712 is then added to the counter variable vco_gain_ctr[1:0] 711 via the adder 717. The [1] element of the added sum of the sign_value signal 712 and the counter variable vc_gain_ctr[1:0] 711 serves as an input to the second logic (AND) gate 702. A reset signal 718 is coupled to the other input node in the second logic gate 702. The output of the second logic gate 702 is coupled to the input (D) of the first latch 706. The output (Q) of the first latch 706 serves as the [1] element in the two-element counter variable vco_gain_ctr[1:0] 711. The [1] element of vco_gain_ctr[1:0] 711 is also received as an input to logic gates that select one or more fine tuning selection signals (713, 714, or 715) from one or more latches (e.g. D flip flops), as further described below. The [0] element of the added sum of the sign_value 712 and vco_gain_ctr[1:0] 711 serves as an input to the third logic (OR) gate 703. The reset signal 718 is inverted prior to its use as the other input to the third logic gate 703. The output of this OR logic gate is coupled to the input (D) of the second latch 707. The output (Q) of this latch 707 serves as the [0] element of vco_gain_ctr[1:0] 711. The [0] element of vco_gain_ctr[1:0] also serves as an input to logic gates that select one or more fine tuning selection signals (713, 714, or 715) from one or more latches, as further described below.

The two-element counter variable vco_gain_ctr[1:0] 711 also serves as an input to two separate digital comparators 632 and 633 in the boundary checker 409. The output of one digital comparator 632, C_check 630, is used to hold vco_gain_ctr[1:0] 711 at a fixed value after the frequency range selection circuit 410 has selected the third gain adjustment circuit 406 in the fine tuning array 403. The output of a separate digital comparator 633, B-check 631, is used to hold vco_gain_ctr[1:0] 711 at a fixed value after the frequency range selection circuit 410 has selected the first gain adjustment circuit 404 in the fine tuning array 403.

The boundary checker 409 and the frequency range selection circuit 410 are at the initial state when the reset variable 718 is enabled. When the boundary checker 409 and the frequency range selection circuit 410 are at the initial state, the counter variable vco_gain_ctr[1:0] 711 is at 2'b01 and the C_check 630 and B_check 631 signals are disabled. When the tuning voltage of the hybrid oscillator 411 is within the pre-determined voltage range of the hybrid oscillator 501 and the coarse tuning signal 412 is below the upper pre-determined value and above the lower pre-determined value, both signals band_ov_rt 628 and band_ud_rt 629 are disabled, which makes sign_value[1:0] 712 have a value of 2'b00. Thus, the counter variable vco_gain_ctr[1:0] 711 is maintained at the previous value of 2'b01.

When both the over_ana 610 and ov_band 619 signals are enabled, the signal band_ov_rt 628 is enabled. Thereafter, the sign_value 712 becomes 2'b01. The vco_gain_ctr[1:0] variable 711 then increases from 2'b1 to 2'b10 and enables the C_check signal 630. In the next cycle, band_ov_rt 628 becomes disabled due to C_check 630 being enabled. This causes sign_value 712 to change from 2'b01 to 2'b00 and causes vco_gain_ctr[1:0] 711 to remain at 2'b01. This means that the fine tuning array 403 has coupled the first gain adjustment circuit 404 to the hybrid oscillator 401. FIG. 10 shows how the different signals in the boundary checker 409 and frequency range selection circuit 410 change according to different values of over_ana 610, under_ana 611, ud_band 618, and ov_band 619.

FIG. 7 also shows how the frequency range selection circuit 410 generates outputs to correspond to the operating frequency range of the hybrid oscillator 401. The output (Q) of the first latch 706 in the frequency range selection circuit 410 is coupled to a buffer and serves as an input (D) to the fifth latch 708. The output (Q) of the fifth latch 708, KVCO-X3 715, is coupled to a third gain adjustment circuit 406 of the fine tuning array 403 during operation of the hybrid oscillator 401 at an upper frequency range. The inverted output (Q) of the first latch 706 is also coupled to an input of a fourth logic (AND) gate 705. The other input of the fourth logic gate 705 is coupled to the output (Q) of the second latch 707. The output of the fourth logic gate 705 is coupled to the input (D) of the fourth latch 709. This output of the fourth logic gate 709, KVCO-X2 714, corresponds to selection of a second gain adjustment circuit 405 of the fine tuning array 403 during operation in a normal frequency range. The inverted output (Q) of the first latch 706 is also coupled to an input of a fifth logic gate 704. The other input of the fifth logic gate 704 is coupled to the inverted output (Q) of the second latch 707. The output of this AND gate 704 is coupled to the input (D) of the third latch 710. The output (Q) of the third latch KVCO-X1 713 is enabled when it is used to select a first gain adjustment circuit 404 of the fine tuning array 403 during operation in a lower frequency range. The "clock" inputs of the latches (e.g., D flip flops) are coupled to a reference input signal 414. Thus, the latches are enabled when the input (D) of each respective latch is enabled and the reference input signal 414 is at a "high" level.

FIG. 8 is a diagram of an example embodiment of hybrid oscillator 401. In an embodiment, the hybrid oscillator 401 includes a fine tuning array 403, a current mirror 415, and a ring oscillator 416. It should be understood to those skilled in the art that the fine tuning array 403, or the current mirror 415, may be an external component to the hybrid oscillator 401 in other embodiments. The fine tuning array 403 includes a first gain adjustment circuit 404, a second gain adjustment circuit 405, and a third gain adjustment circuit 406. The outputs of the frequency range selection circuit 410 are fine tuning selection signals 713, 714, and 715, and are inputs to the fine tuning array 403. The fine tuning array 403 couples one of the gain adjustment circuits 404, 405, or 406 to the current mirror 415 to produce gain adjustment signal 402, depending on the operating frequency range of the hybrid oscillator 401. In the embodiment of the present disclosure, the gain adjustment circuits 404, 405, and 406 employ n-channel MOSFETs. During operation in the upper frequency range (or "SS" process corner), fine tuning selection signal KVCO-X3 715 is enabled. KVCO-X3 715 is coupled to the gate terminal of a large n-channel MOSFET 406 that is used to increase the gain of the hybrid oscillator 401 so that the hybrid oscillator 401 can output a signal with a frequency that matches the frequency of the reference input signal 414 at the upper specified frequency range of the hybrid PLL 400. Similarly, during operation in the lower frequency range (or "FF" process corner), fine tuning selection signal KVCO-X1 713 is enabled. KVCO-X1 713 is coupled to the gate terminal of a smaller n-channel MOSFET 404 to decrease the gain of the hybrid oscillator 401 so that the hybrid oscillator 401 can output a signal with a frequency that matches the frequency of the reference input signal 414 at the lower specified frequency range of the hybrid PLL 400. During operation in a normal frequency range (or "TT" process corner), fine tuning selection signal KVCO-X2 714 is enabled. KVCO-X2 714 is coupled to the gate terminal of a typical n-channel MOSFET 405 to maintain the gain of the hybrid oscillator 401 during normal frequency operation. FIG. 11 shows a table demonstrating the relationship between the circuit counter variable vco_gain_ctr[1:0] 711, the fine tuning selection signals {KVCO-X3, KVCO-X2, KVCO-X1}, and the selected gain adjustment device, which are n-channel MOSFETs in the present disclosure.

For example, the fine tuning array 403 may adopt the typical n-channel MOSFET of the second gain adjustment circuit 405 to maintain a gain of 8 GHz/V for the hybrid oscillator 401 at the "TT" process corner. At the "FF" process corner, the fine tuning array 403 may adopt the smaller n-channel MOSFET of the first gain adjustment circuit 404 to decrease the gain of the hybrid oscillator 401 from 10 GHz/V to under 9 GHz/V. Similarly, at the "SS" process corner, the fine tuning array 403 may adopt the large n-channel MOSFET of the third gain adjustment circuit 406 to increase the gain of the hybrid oscillator 401 from 5 GHz/V to over 8 GHz/V. In this way the hybrid oscillator 401 can fully cover the specified frequency range of the hybrid PLL 400.

Figure 12:
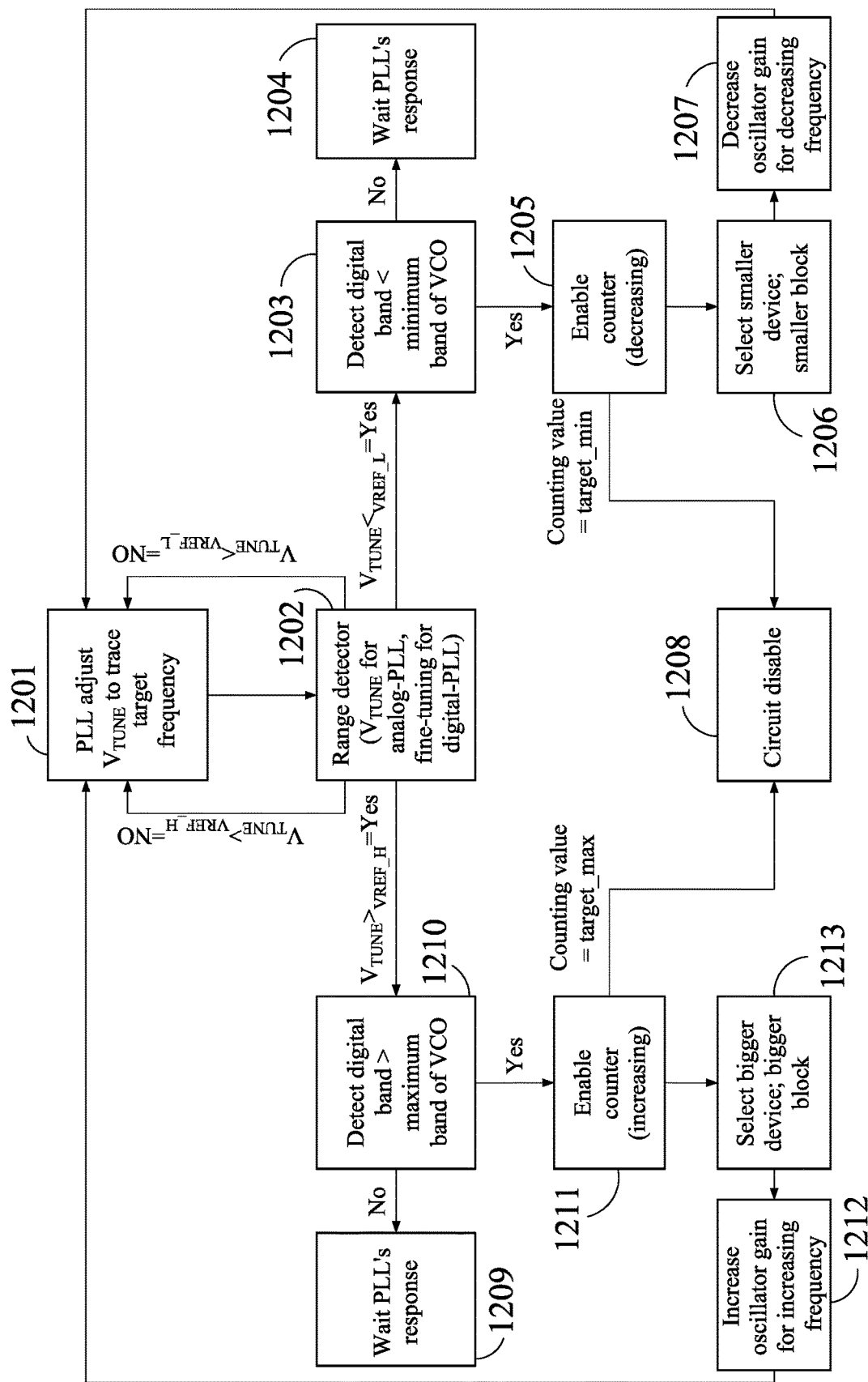
FIG. 12 is a flow chart of an embodiment showing how an embodiment of an automatic hybrid oscillator gain adjustor circuit operates according to various conditions of parameters of an automatic hybrid oscillator gain adjustor circuit.

FIG. 12 is a flow chart showing how an example embodiment of the automatic hybrid oscillator gain adjustor circuit operates according to different values of its parameters. For example, a hybrid PLL 400 will adjust the tuning voltage 411 to trace the target frequency of an input signal 414. This is shown in block 1201. During operation in normal frequency ranges, this target frequency can be matched by adjusting the tuning voltage 411 with a typical gain of the hybrid oscillator 401. However, when the target frequency is outside of a specified frequency range, a typical gain of the hybrid oscillator 401 will not suffice for tuning the hybrid oscillator 401 to match the target frequency. Thus, the automatic hybrid oscillator gain adjustor circuit will select an appropriate gain adjustment circuit from the fine tuning array 403 so that the hybrid oscillator 401 is able to produce an output signal 413 with a frequency that matches the reference input signal 414 at these upper and lower frequency ranges.

For example, during operation in a lower frequency, the PLL will adjust the fine tuning signal VTUNE 411 to trace the target frequency (the frequency of the input signal 414). This is demonstrated in block 1201. As shown in block 1202, the voltage range detector 501 will determine that the fine tuning signal 411 has dropped below the pre-determined voltage range. The logic of the flowchart of FIG. 12 will then proceed to block 1203, and detect whether the course signal 412 is less than the minimum pre-determined value, as specified in the digital comparator 614. If the coarse tuning signal 412 is equal to or greater than this value, block 1204 indicates that the PLL will simply wait for a response. If the coarse tuning signal 412 is below the value of the digital comparator 614, the counter variable 711 of the frequency range selection circuit 410 will be decreased. This is shown in block 1205. A small gain adjustment circuit 404 from the fine tuning array 403 will then be selected, as shown in 1206. This will decrease the gain of the hybrid oscillator 401, as shown in block 1207, and the PLL will return to adjusting the fine tuning signal VTUNE 411 to trace the target frequency. This is shown in FIG. 12 by the return from block 1207 to block 1201.

Figure 13:
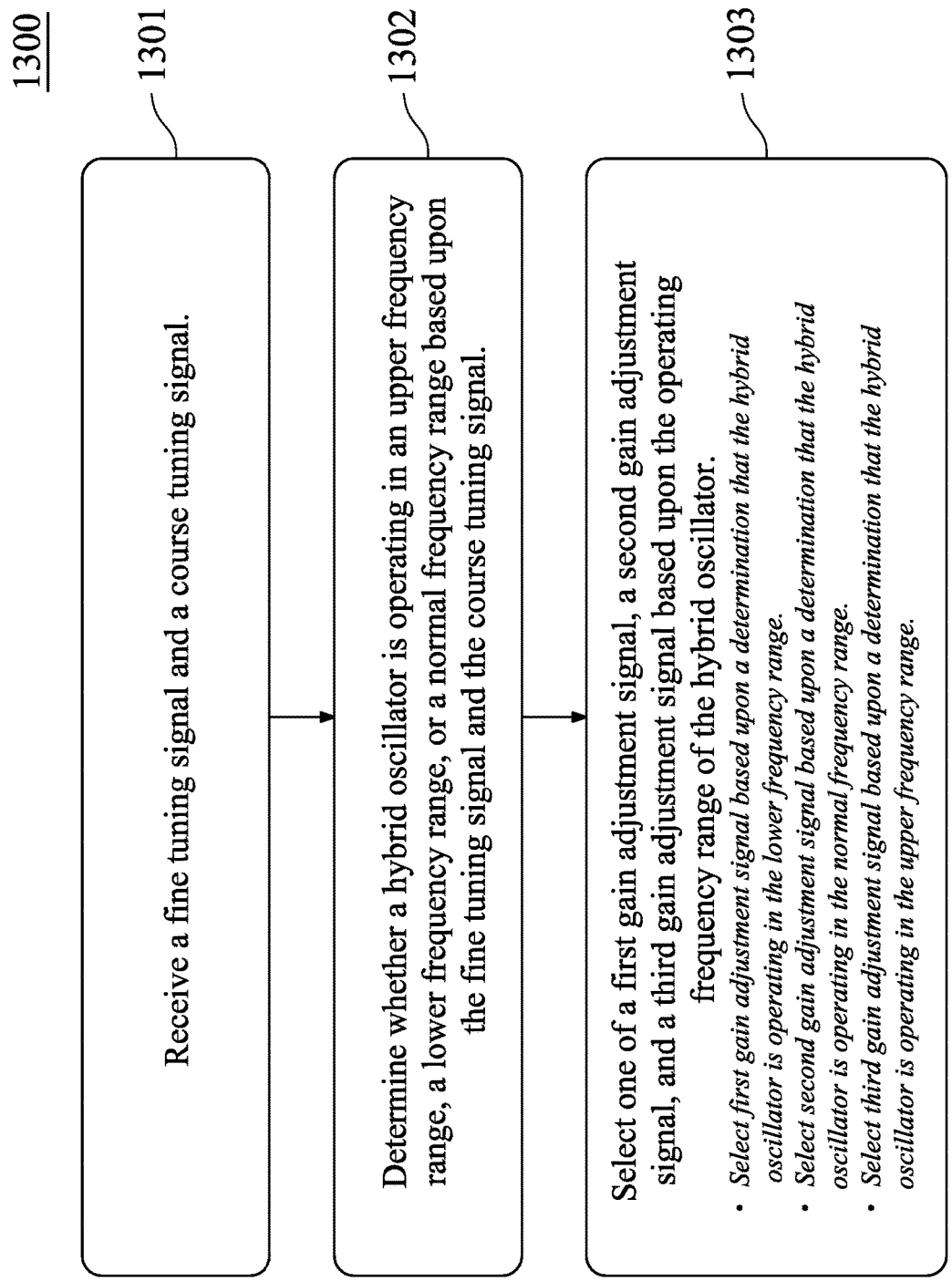
FIG. 13 is a flowchart demonstrating a method of selecting a gain adjustment circuit for a hybrid oscillator.

FIG. 13 shows a method 1300 of selecting a gain adjustment circuit for a hybrid oscillator. To select an appropriate gain adjustment circuit for a hybrid oscillator, the first step 1301 is to receive a fine tuning signal and a coarse tuning signal. The next step 1302 is to determine whether a hybrid oscillator is operating in an upper frequency range, a lower frequency range, or a normal frequency range based upon the fine tuning signal and the coarse tuning signal. The last step 1303, according to an example in the present disclosure, is to select one of a first gain adjustment signal, a second gain adjustment signal, and a third gain adjustment signal based upon the operating frequency range of the hybrid oscillator. A first gain adjustment signal may be selected based upon a determination that the hybrid oscillator is operating in the lower frequency range. A second gain adjustment signal may be selected based upon a determination that the hybrid oscillator is operating in the normal frequency range. Finally, a third gain adjustment signal may be selected based upon a determination that the hybrid oscillator is operating in the upper frequency range.

Figure 14:
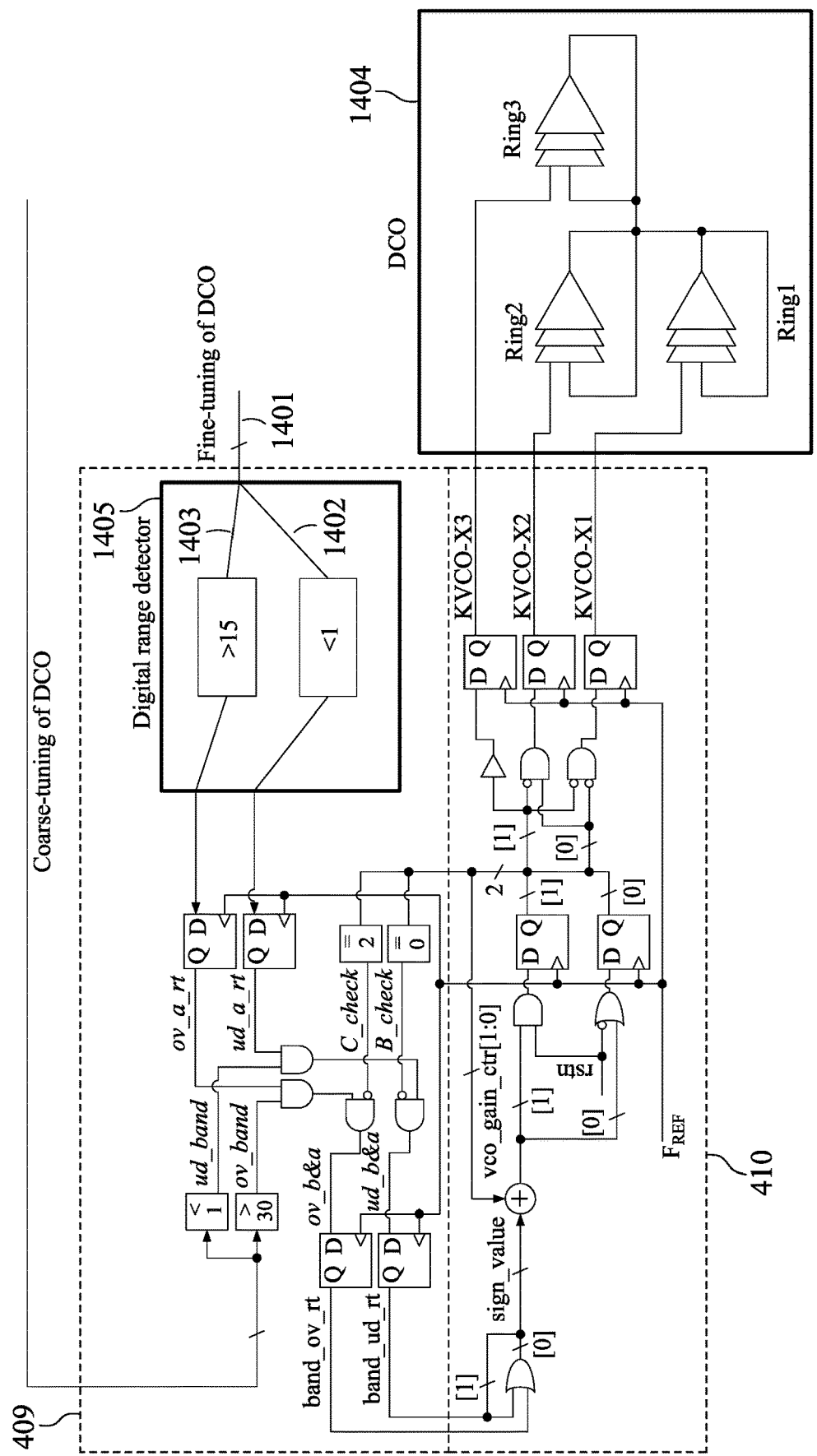
FIG. 14 is a block diagram for an implementation of the circuit in an all-digital PLL (ADPLL).

FIG. 14 shows an example embodiment of the automatic hybrid oscillator gain adjustor circuit wherein the circuit is implemented in an all digital phase lock loop (ADPLL). In this example, the fine tuning of the ADPLL is implemented with a fine tuning digital bank. The fine tuning digital bank produces a fine tuning code 1401, which serves as an input to a digital range detector 1405. In the example shown in FIG. 14, this includes a comparator for a high pre-determined level 1403, and a comparator for a low pre-determined level 1402. The digital comparators will generate one or more signals depending on whether the fine tuning code is within, above, or below the range of the digital range detector 1405. This is analogous to the fine tuning signal of the hybrid PLL being received at the voltage range detector 501. The implementation of the automatic hybrid oscillator gain adjustor circuit in an ADPLL also differs from the implementation in a hybrid PLL because the fine tuning selection signals are received by a digital controlled oscillator (DCO) array 1404, rather than MOSFETs of a fine tuning array for a hybrid PLL. In the ADPLL, each DCO in the DCO array 1404 is responsible for different frequency ranges and gain of the oscillator. Similar to the hybrid oscillator application, the ADPLL will employ a boundary checker 409 and a frequency range selection circuit 410 to ensure that the appropriate DCO is selected from the DCO array 1404.

The foregoing detailed description discloses an automatic hybrid oscillator gain adjustor circuit. In one embodiment, an automatic hybrid oscillator gain adjustor circuit includes a hybrid oscillator that receives a gain adjustment signal and a coarse tuning signal and generates an output signal having a frequency and phase that are controlled by the gain adjustment signal and the coarse tuning signal. The automatic hybrid oscillator may include a fine tuning array that receives one or more fine tuning selection signals. This fine tuning array may further include a first fine tuning circuit, a second fine tuning circuit and a third fine tuning circuit. The fine tuning array may be configured to select one of the first, second, and third fine tuning circuits for generation of the gain adjustment signal based on the one or more fine tuning selection signals. For example, the first fine tuning circuit may be configured to generate the gain adjustment signal with a first gain adjustment selected for a lower frequency range of the hybrid oscillator. The second fine tuning circuit may be configured to generate the gain adjustment signal with a second gain adjustment selected for a normal frequency range of the hybrid oscillator. The third fine tuning circuit may be configured to generate the gain adjustment signal with a third gain adjustment selected for an upper frequency range of the hybrid oscillator.

The automatic hybrid oscillator gain adjustor circuit may further include a fine tuning control circuit. This fine tuning control circuit may be configured to receive a fine tuning signal, a reference input signal, and a coarse tuning signal and to generate the one or more fine tuning selection signals. The fine tuning control circuit may also be configured to determine whether the hybrid oscillator is operating within the upper frequency range, the normal frequency range, or the lower frequency range based on the fine tuning and coarse tuning signals. The fine tuning control circuit may also be configured to generate the one or more fine tuning selection signals indicating selection of the first fine tuning circuit when the hybrid oscillator is operating within the lower frequency range, indicating selection of the second fine tuning circuit when the hybrid oscillator is operating within the normal frequency range, and indicating selection of the third fine tuning circuit when the hybrid oscillator is operating within the upper frequency range.

The foregoing detailed description additionally discloses a method for selecting a gain adjustment circuit for a hybrid oscillator. The method includes receiving a fine tuning signal and a coarse tuning signal; generating one or more signals corresponding to an operating frequency range of the hybrid oscillator; selecting a gain adjustment device based upon an operating frequency range of the hybrid oscillator; and generating a gain adjustment signal.

The foregoing detailed description also discloses a hybrid phase lock loop. In an example, such a phase lock loop includes an analog control loop. The analog control loop may be configured to generate a fine tuning signal during a phase tracking mode of the hybrid phase lock loop. The hybrid phase lock loop may further include a digital control loop that is configured to generate a coarse tuning signal during a frequency tracking mode of the hybrid phase lock loop. The hybrid phase lock loop may further include a hybrid oscillator gain adjustor circuit. Such a hybrid oscillator gain adjustor circuit may be configured to receive the fine tuning signal and the course coarse tuning signal and to generate a gain adjustment signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An automatic hybrid oscillator gain adjustor circuit, comprising:
 a hybrid oscillator configured to receive a fine tuning signal, a coarse tuning signal, and one or more fine tuning selection signals and to generate an output signal having a frequency and phase that are proportional to the frequency and phase of a reference input signal;
  wherein the hybrid oscillator comprises a fine tuning array that receives the one or more fine tuning selection signals and includes a first fine tuning circuit, a second fine tuning circuit, and a third fine tuning circuit, wherein the fine tuning array is configured to select one of the first, second, and third fine tuning circuits for generation of a gain adjustment signal based on the one or more fine tuning selection signals, and wherein,
  the first fine tuning circuit is configured to generate the gain adjustment signal with a first gain adjustment selected for a lower frequency range of the hybrid oscillator,
  the second fine tuning circuit is configured to generate the gain adjustment signal with a second gain adjustment selected for a normal frequency range of the hybrid oscillator, and
  the third fine tuning circuit is configured to generate the gain adjustment signal with a third gain adjustment selected for an upper frequency range of the hybrid oscillator;
 a fine tuning control circuit configured to receive the fine tuning signal, the coarse tuning signal, and the reference input signal and to generate the one or more fine tuning selection signals,
  wherein the fine tuning control circuit is configured to determine whether the hybrid oscillator is operating within an upper frequency range, a normal frequency range, or a lower frequency range based on the fine tuning and coarse turning signals, and
  wherein the fine tuning control circuit is further configured to generate the one or more fine tuning selection signals indicating selection of the first fine tuning circuit when the hybrid oscillator is operating within the lower frequency range, indicating selection of the second fine tuning circuit when the hybrid oscillator is operating within the normal frequency range, and indicating selection of the third fine tuning circuit when the hybrid oscillator is operating within the upper frequency range.

2. The automatic hybrid oscillator gain adjustor circuit of claim 1, wherein:
 the upper frequency range corresponds to an "SS" process corner in which the hybrid oscillator is unable to generate the output signal having a frequency and phase that are proportional to the frequency and phase of the reference input signal with a typical gain of the hybrid oscillator,
 the normal frequency range corresponds to a "TT" process corner in which the hybrid oscillator is able to generate the output signal having a frequency and phase that are proportional to the frequency and phase of the reference input signal with the typical gain of the hybrid oscillator, and
 the lower frequency range corresponds to an "FF" process corner in which the hybrid oscillator is unable to generate the output signal having a frequency and phase that are proportional to the frequency and phase of the reference input signal with the typical gain of the hybrid oscillator.

3. The automatic hybrid oscillator gain adjustor circuit of claim 1, wherein the fine tuning control circuit comprises:
 a boundary checker configured to receive the fine tuning signal from an analog control loop and the coarse tuning signal from a digital control loop, and generate one or more signals that correspond to one distinct frequency range of the hybrid oscillator; and
 a frequency range selection circuit configured to receive the combination of one or more signals corresponding to a unique frequency range from the boundary checker and generate the one or more fine tuning selection signals corresponding to an operation of the hybrid oscillator in the distinct frequency range.

4. The automatic hybrid oscillator gain adjustor circuit of claim 3, wherein the boundary checker comprises a first digital comparator, a second digital comparator, and a voltage range detector, and wherein:
 the boundary checker receives the coarse tuning signal as an input to both the first digital comparator and the second digital comparator;
 the output of the first digital comparator is enabled when the coarse tuning signal is below a pre-determined value;
 the output of the second digital comparator is enabled when the coarse tuning signal is above a pre-determined value; and
 the voltage range detector is configured to receive the fine tuning signal and to generate one or more signals corresponding to the fine tuning signal of the hybrid oscillator being within, above, or below an analog voltage range.

5. The automatic hybrid oscillator gain adjustor circuit of claim 4, wherein the voltage range detector comprises a first amplifier, a second amplifier, and a voltage divider, and wherein:
 the output of the first amplifier is enabled when the fine tuning signal of the hybrid oscillator is higher than the analog voltage range, and
 the output of the second amplifier is enabled when the fine tuning signal of the hybrid oscillator is lower than the analog voltage range.

6. The automatic hybrid oscillator gain adjustor circuit of claim 1, wherein the hybrid oscillator further comprises a current mirror, and wherein:
 the current mirror is configured to receive the gain adjustment signal and the coarse tuning signal and to generate a tuning signal that is the sum of the gain adjustment signal and the coarse tuning signal.

7. The automatic hybrid oscillator gain adjustor circuit of claim 6, wherein the hybrid oscillator further comprises a ring oscillator, and wherein:

the ring oscillator is configured to receive the tuning signal that is the sum of the gain adjustment signal and the coarse tuning signal and to generate the output signal having a frequency and phase that are proportional to the frequency and phase of the reference input signal.

8. The automatic hybrid oscillator gain adjustor circuit of claim 2, wherein:
the first fine tuning circuit comprises a large MOSFET;
the second fine tuning circuit comprises a typical MOSFET; and
the third fine tuning circuit comprises a small MOSFET.

9. The automatic hybrid oscillator gain adjustor circuit of claim 8, wherein:
the first fine tuning circuit is used to increase the gain of the hybrid oscillator during operation at the "FF" process corner;
the second fine tuning circuit is used to maintain the gain of the hybrid oscillator during operation at the "TT" process corner; and
the third fine tuning circuit is used to decrease the gain of the hybrid oscillator during operation at the "SS" process corner.

10. The automatic hybrid oscillator gain adjustor circuit of claim 9, wherein:
the gate terminal of the large MOSFET is coupled to the output of the frequency range selection circuit corresponding to an operation at the "SS" process corner,
the gate terminal of the small MOSFET is coupled to the output of the frequency range selection circuit corresponding to an operation at the "FF" process corner, and
the gate terminal of the first typical MOSFET is coupled to the output of the frequency range selection circuit corresponding to an operation at the "TT" process corner.

11. The automatic hybrid oscillator gain adjustor circuit of claim 10, wherein the drain terminals of the large, small, and typical MOSFETs in the array share a common node, which is coupled to an input node of the current mirror.

12. The automatic hybrid oscillator gain adjustor circuit of claim 11, wherein the fine tuning array further comprises a fourth MOSFET, a fifth MOSFET, and a sixth MOSFET, and wherein:
the source terminal of the large MOSFET is coupled to the drain terminal of the fourth MOSFET,
the source terminal of the small MOSFET is coupled to the drain terminal of the fifth MOSFET,
the source terminal of the first typical MOSFET is coupled to the drain terminal of the sixth MOSFET,
the fine tuning signal is coupled to the gate terminals of each of the fourth, fifth, and sixth MOSFETs, and
the source terminals of the fourth, fifth, and sixth MOSFETs are coupled to electrical ground.

13. A method of selecting a gain adjustment circuit for a hybrid oscillator, comprising the steps of:
receiving a fine tuning signal and a coarse tuning signal;
determining whether a hybrid oscillator is operating in an upper frequency range, a lower frequency range, or a normal frequency range based upon the fine tuning signal and the coarse tuning signal; and
selecting one of a first gain adjustment signal, a second gain adjustment signal, and a third gain adjustment signal based upon the operating frequency range of the hybrid oscillator,
wherein the first gain adjustment signal is selected based upon a determination that the hybrid oscillator is operating in the lower frequency range, wherein the second gain adjustment signal is selected based upon a determination that the hybrid oscillator is operating in the normal frequency range, and wherein the third gain adjustment signal is selected based upon a determination that the hybrid oscillator is operating within the upper frequency range.

14. The method of claim 13, wherein the step of determining whether a hybrid oscillator is operating in the upper frequency range, the lower frequency range, or the normal frequency range based upon the fine tuning signal and the coarse tuning signal further comprises:
comparing the fine tuning signal to an analog voltage range;
determining whether the fine tuning signal is above, below, or within the analog voltage range; and
generating one or more signals corresponding to the fine tuning signal being above, below, or within the analog voltage range.

15. The method of claim 14, wherein the step of determining whether a hybrid oscillator is operating in the upper frequency range, the lower frequency range, or the normal frequency range based upon the fine tuning signal and the coarse tuning signal further comprises:
comparing the coarse tuning signal to an upper pre-determined value and a lower pre-determined value;
determining whether the coarse tuning signal is above the upper pre-determined value, below the lower pre-determined value, or above the lower pre-determined value and below the upper pre-determined value; and
generating one or more signals corresponding to the coarse tuning signals being above the upper pre-determined value, below the lower pre-determined value, or above the lower pre-determined value and below the upper pre-determined value.

16. A hybrid phase lock loop, comprising:
an analog control loop configured to receive a reference input signal and an output signal having a frequency and phase that are proportional to the frequency and phase of the reference input signal and to generate a fine tuning signal during a phase tracking mode of the hybrid phase lock loop;
a digital control loop configured to receive the reference input signal and the output signal having a frequency and phase that are proportional to the frequency and phase of the reference input signal and to generate a coarse tuning signal during a frequency tracking mode of the hybrid phase lock loop;
a fine tuning control circuit configured to receive the fine tuning signal, the coarse tuning signal, and the reference input signal and to generate one or more fine tuning selection signals based upon a determination that the hybrid phase lock loop is operating in a lower frequency range, a normal frequency range, or an upper frequency range; and
a hybrid oscillator configured to receive the fine tuning signal, the coarse tuning signal, and the one or more fine tuning selection signals and to generate an output signal having a frequency and phase that are proportional to the frequency and phase of the reference input signal;
wherein the hybrid oscillator comprises a fine tuning array that receives the one or more fine tuning selection signals and includes a first fine tuning circuit, a second fine tuning circuit, and a third fine tuning circuit, wherein the fine tuning array is configured to select one of the first, second, and third fine tuning circuits for generation of a gain adjustment signal based on the one or more fine tuning selection signals, and wherein,
the first fine tuning circuit is configured to generate the gain adjustment signal with a first gain adjustment selected for the lower frequency range of the hybrid oscillator,
the second fine tuning circuit is configured to generate the gain adjustment signal with a second gain adjustment selected for the normal frequency range of the hybrid oscillator, and
the third fine tuning circuit is configured to generate the gain adjustment signal with a third gain adjustment selected for the upper frequency range of the hybrid oscillator.

17. The hybrid phase lock loop of claim 16, wherein:
the upper frequency range corresponds to an "SS" process corner in which the hybrid oscillator is unable to generate the output signal having a frequency and phase that are proportional to the frequency and phase of the reference input signal with a typical gain of the hybrid oscillator;
the normal frequency range corresponds to a "TT" process corner in which the hybrid oscillator is able to generate the output signal having a frequency and phase that are proportional to the frequency and phase of the reference input signal with the typical gain of the hybrid oscillator; and
the lower frequency range corresponds to an "FF" process corner in which the hybrid oscillator is unable to generate the output signal having a frequency and phase that are proportional to the frequency and phase of the reference input signal with the typical gain of the hybrid oscillator.

18. The hybrid phase lock loop of claim 17, wherein the hybrid oscillator further comprises a current mirror and a ring oscillator, and wherein:
the current mirror is configured to receive the gain adjustment signal and the coarse tuning signal and to generate a tuning signal that is the sum of the gain adjustment signal and the coarse tuning signal; and
the ring oscillator is configured to receive the tuning signal that is the sum of the gain adjustment signal and the coarse tuning signal and to generate the output signal having a frequency and phase that are proportional to the frequency and phase of the reference input signal.

19. The hybrid phase lock loop of claim 17, wherein the fine tuning control circuit further comprises:
a boundary checker configured to receive the fine tuning signal from the analog control loop and the coarse tuning signal from the digital control loop, and to generate one or more signals that correspond to one distinct frequency range of the hybrid oscillator; and
a frequency range selection circuit configured to receive the combination of one or more signals corresponding to a unique frequency range from the boundary checker and generate the one or more fine tuning selection signals corresponding to an operation of the hybrid oscillator in the distinct frequency range.

20. The hybrid phase lock loop of claim 17, wherein:
the first fine tuning circuit is used to increase the gain of the hybrid oscillator during operation at the "FF" process corner;
the second fine tuning circuit is used to maintain the gain of the hybrid oscillator during operation at the "TT" process corner; and
the third fine tuning circuit is used to decrease the gain of the hybrid oscillator during operation at the "SS" process corner.

* * * * *